(12) United States Patent
Kaibara et al.

(10) Patent No.: US 7,629,635 B2
(45) Date of Patent: Dec. 8, 2009

(54) SEMICONDUCTOR MEMORY AND DRIVING METHOD FOR THE SAME

(75) Inventors: Kazuhiro Kaibara, Osaka (JP); Shinzo Koyama, Osaka (JP); Yoshihisa Kato, Shiga (JP)

(73) Assignee: Panasonic Corporation, Osaka (JP)

( * ) Notice: Subject to any disclaimer, the term of this patent is extended or adjusted under 35 U.S.C. 154(b) by 266 days.

(21) Appl. No.: 11/520,011

(22) Filed: Sep. 13, 2006

(65) Prior Publication Data

US 2007/0063238 A1 Mar. 22, 2007

(30) Foreign Application Priority Data

Sep. 14, 2005 (JP) ............................. 2005-267553
Mar. 3, 2006 (JP) ............................. 2006-058486

(51) Int. Cl.
*H01L 29/51* (2006.01)

(52) U.S. Cl. ............................. 257/295; 257/E27.104; 365/145

(58) Field of Classification Search ................. 365/145; 257/E27.104, 295
See application file for complete search history.

(56) References Cited

U.S. PATENT DOCUMENTS 6,150,184 A * 11/2000 Evans et al. ..................... 438/3

FOREIGN PATENT DOCUMENTS

JP 2003-332538 * 11/2003
JP 2003-332538 A 11/2003

* cited by examiner

*Primary Examiner*—Jerome Jackson, Jr.
*Assistant Examiner*—Paul A Budd
(74) *Attorney, Agent, or Firm*—McDermott Will & Emery LLP

(57) ABSTRACT

A semiconductor memory includes a conducting film formed on a substrate; a ferroelectric film formed above or below the conducting film; a source electrode and a drain electrode disposed in positions opposing the conducting film with the ferroelectric film sandwiched therebetween and spaced from each other; and an insulating film formed between the source electrode and the drain electrode.

11 Claims, 11 Drawing Sheets

SEMICONDUCTOR MEMORY AND DRIVING METHOD FOR THE SAME

BACKGROUND OF THE INVENTION

The present invention relates to a ferroelectric memory device using a ferroelectric film as a gate insulating film.

Nonvolatile memories using ferroelectric films are roughly divided into two types of memories, that is, capacitor type memories and MFSFET (metal-ferroelectric-semiconductor field effect transistor) type memories.

In a capacitor type nonvolatile memory, stored data is broken in reading it, and hence, it is necessary to perform an operation for writing the data again. Therefore, since the polarization of a ferroelectric film is inverted every time data is read, there arises a problem of polarization inversion fatigue of the ferroelectric film. Also, there are a large number of problems not only in mass production of 1T1C type memories but also in refining such memories.

On the other hand, in an MFSFET type nonvolatile memory, data is read by detecting a conducting state of a channel, which is changed in accordance with the direction of polarization of a ferroelectric film, and therefore, data can be read without inverting the polarization, namely, data can be read in a nonerasable manner. Also, as compared with a capacitor type nonvolatile memory, a memory cell region can be refined and the refinement has been studied for a long period of time. In an MFSFET type nonvolatile memory, however, a ferroelectric film should be formed on a silicon substrate. It is not easy to form a ferroelectric film on a silicon substrate, and even an MFISFET (metal-ferroelectric-insulator-semiconductor field effect transistor) type nonvolatile memory proposed for overcoming this problem has problems in flat band shift and memory storage.

In order to overcome the aforementioned problems, an interface conducting device having a structure for reading data by allowing a carrier to be transmitted through an interface between a ferroelectric film and an insulating film has been conventionally proposed (see, for example, Japanese Laid-Open Patent Publication No. 2003-332538).

Structure of Conventional Semiconductor Memory

FIG. 12 is a cross-sectional view of a principal part of semiconductor memory including a conventional interface conducting device.

As shown in FIG. 12, a conducting film 102 and an insulating film 103 are successively formed in this order on a semiconductor substrate 101. A source electrode 104 and a drain electrode 105 spaced from each other are formed on the insulating film 103. Also, a ferroelectric film 106 is formed on a portion of the insulating film 103 sandwiched between the source electrode 104 and the drain electrode 105. A gate electrode 107 is formed on the ferroelectric film 106.

SUMMARY OF THE INVENTION

In the case where data is written in the conventional semiconductor memory, a voltage is applied between the gate electrode 107 and the conducting film 102 so as to define the direction of the polarization of the ferroelectric film 106 as described above. However, since the insulating film 103 is also present between the gate electrode 107 and the conducting film 102 apart from the ferroelectric film 106, it is necessary to apply a high voltage between the gate electrode 107 and the conducting film 102 for causing sufficient polarization in the ferroelectric film 106. Therefore, the device should be designed in consideration of the dielectric breakdown of the insulating film 103 and the ferroelectric film 106 and the dielectric constant of the ferroelectric film, and hence, the device is largely restricted in the shape, the material and the like.

Furthermore, in order to cause polarization in the ferroelectric film 106, the gate electrode 107 is indispensable, and hence, the gate electrode 107 largely disturbs the refinement of the semiconductor memory.

Moreover, in the case where the interface conducting device included in the conventional semiconductor memory is provided in the form of an array, there arise problems as follows:

FIG. 13 is a circuit diagram of the conventional interface conducting device provided in the form of an array.

In FIG. 13, first through sixth devices 201 through 206, each of which is the conventional interface conducting device, are arranged in the form of an array, a source line $SL_0$ and a bit line $BL_0$ respectively connected to source electrodes and drain electrodes of the first through third devices 201 through 203 are provided, and similarly, a source lines $SL_1$ and a bit line $BL_1$ respectively connected to source electrodes and drain electrodes of the fourth through sixth devices 204 through 206 are provided. Also, a word line $WL_0$ is connected to one electrode of ferroelectric capacity of each of the first and fourth devices 201 and 204, a word line $WL_1$ is connected to one electrode of ferroelectric capacity of each of the second and fifth devices 202 and 205, and a word line $WL_2$ is connected to one electrode of ferroelectric capacity of each of the third and sixth devices 203 and 206. Furthermore, a plate line $PL_0$ is connected to the other electrode of the ferroelectric capacity of each of the first through third devices and a plate line $PL_1$ is connected to the other electrode of the ferroelectric capacity of each of the fourth through sixth devices.

As described above, in a memory device using the interface conducting device, a current passing through the interface between the ferroelectric film and the insulating film is detected, and since the amplitude of the current passing through the interface is different depending upon the direction of the polarization, the difference of the polarization direction is read as data. However, in reading data from, for example, the first device 201, a current between the source line $SL_0$ and the bit line $BL_0$ flows also to the second device 202 and the third device 203. Therefore, when a plurality of devices are connected to one bit line, there arises a problem that data cannot be uniquely detected. Also, in a write operation, the polarization state of a device not selected for the write operation is broken, and hence, there arises a problem that a read error is caused in reading data of this device. Specifically, when data is written in, for example, the first device 201, a voltage pulse is applied to the word line $WL_0$ and the source line $WL_0$, and, for example, the source line $SL_1$, connected to the fourth device 204 not to be written is placed in a high-impedance state so as to prevent voltage application to the ferroelectric capacity of the fourth device 204. However, the source line $SL_1$ is actually capacitively coupled to, for example, the substrate, and hence a slight voltage is caused in the source line $SL_1$. As a result, in writing data in the first device 201, the slight voltage is applied to the fourth device 204 not to be written, which causes a disturb problem that the polarization of the ferroelectric of the fourth device 204 is reduced.

In consideration of the above-described conventional problems, an object of the invention is providing a semiconductor memory using a ferroelectric film that has high design freedom and a refinable structure. Another object of the invention is providing a semiconductor memory in which read data can be uniquely determined and the disturb problem can be prevented.

In order to achieve the object, the first semiconductor memory of this invention includes a conducting film formed on a substrate; a ferroelectric film formed above or below the conducting film; a source electrode and a drain electrode disposed in positions opposing the conducting film with the ferroelectric film sandwiched therebetween and spaced from each other; and an insulating film formed between the source electrode and the drain electrode.

In the first semiconductor memory of this invention, polarization inversion caused in a portion of the ferroelectric film disposed above or below the insulating film is used for detecting carriers conducting through the interface between the ferroelectric film and the insulating film, and thus, data can be read and written. In other words, when a voltage is applied between the conducting film and at least one of the source electrode and the drain electrode, an electric field generated from each end of at least one of the source electrode and the drain electrode is formed in the portion of the ferroelectric film disposed above or below the insulating film. Therefore, the polarization inversion caused in this portion can be used for writing data, and data can be read by detecting conductivity of the carriers on the interface between the ferroelectric film and the insulating film, which is changed in accordance with the polarization inversion in this portion. Furthermore, in this semiconductor memory, the voltage application necessary for writing data is performed on a single layer of the ferroelectric film alone, and therefore, the semiconductor memory is not restricted in the device design as in the conventional technique and the design freedom is improved. Moreover, in this semiconductor memory, the voltage application necessary for writing data can be performed by using the conducting film and at least one of the source electrode and the drain electrode, and there is no need to use a gate electrode as in the conventional technique. Therefore, this semiconductor memory has a good structure for refinement.

In the first semiconductor memory of the invention, the conducting film is preferably formed in each unit device forming region composed of, in a plan view, a region where the source electrode is disposed, a region where the drain electrode is disposed and a region where an interface between the ferroelectric film and the insulating film is disposed.

Thus, the conducting film is formed in each unit device forming region. Therefore, when the semiconductor memory included in the unit device is disposed in the form of an array, a voltage can be applied selectively to a ferroelectric film of each unit device.

In the first semiconductor memory of the invention, the conducting film is preferably formed above or below an interface between the ferroelectric film and the insulating film.

Thus, a voltage can be selectively applied to merely a portion of the ferroelectric film included in the unit device forming region where the polarization inversion needs to be caused. Furthermore, the conducting film is disposed above or below the interface between the ferroelectric film and the insulating film, and in the case where the conducting film does not overlap, in a plan view, regions where the source electrode and the drain electrode are disposed or overlaps them merely slightly, even if a high voltage is applied between the conducting film and at least one of the source electrode and the drain electrode, the polarization inversion can be definitely caused in the portion of the ferroelectric film disposed above or below the insulating film without causing dielectric breakdown in the ferroelectric film.

The first semiconductor memory of the invention preferably further includes electric field forming means for forming an electric field in a portion of the ferroelectric film disposed above or below the insulating film by using the conducting film and at least one of the source electrode and the drain electrode.

In the first semiconductor memory of the invention, the conducting film preferably includes a first portion opposing the source electrode with the ferroelectric film sandwiched therebetween; and a second portion spaced from the conducting film and opposing the drain electrode with the ferroelectric film sandwiched therebetween.

Thus, a voltage can be selectively applied merely to a portion of the ferroelectric film included in the unit device forming region where the polarization inversion needs to be caused. Furthermore, when at least one of a combination of the first portion and the drain electrode and a combination of the second portion and the source electrode is used, the electric field can be efficiently formed in the portion of the ferroelectric film disposed above or below the insulating film. Moreover, since such combinations are used, even if a high voltage is applied to at least one of the combinations, the polarization inversion can be definitely caused in the portion of the ferroelectric film disposed above or below the insulating film without causing the dielectric breakdown in the ferroelectric film.

The first semiconductor memory of the invention preferably further includes electric field forming means for forming an electric field in a portion of the ferroelectric film disposed above or below the insulating film by using at least one of a combination of the first portion and the drain electrode and a combination of the second portion and the source electrode.

In the first semiconductor memory of the invention, a polarization direction of crystal grains included in the portion of the ferroelectric film disposed above or below the insulating film preferably substantially accords with a direction of the electric field formed in the portion of the ferroelectric film disposed above or below the insulating film.

Thus, the polarization inversion can be caused in the portion of the ferroelectric film disposed above or below the insulating film with a minimum electric field. Specifically, on the interface between the ferroelectric film and the insulating film used for conducting the carriers, an electric field is formed obliquely or parallel to the interface, and therefore, the ferroelectric film is preferably formed so as to make the polarization direction of the crystal grains included in the portion of the ferroelectric film disposed above or below the interface oblique or parallel to the interface.

In the first semiconductor memory of the invention, a portion of the ferroelectric film disposed above or below the insulating film preferably includes a single crystal grain.

Thus, the influence of electrons trapped in crystal grains can be avoided, and hence, the change of the conductivity of the carriers on the interface between the ferroelectric film and the insulating film can be stabilized.

In the first semiconductor memory of the invention, the insulating film preferably has a higher dielectric constant than the ferroelectric film.

Thus, most of electric flux lines generated from each end or the like of at least one of the source electrode and the drain electrode and extending toward the conducting film disposed in the portion of the ferroelectric film disposed above or below the insulating film are once largely extruded toward the insulating film provided between the source electrode and the drain electrode before reaching the conducting film. Therefore, on the interface between the ferroelectric film and the insulating film for conducting the carriers, the electric field is formed vertically to the interface. Accordingly, the portion of the ferroelectric film disposed above or below the insulating film where the polarization direction of the crystal grains is vertical to the interface can be effectively used for reading/ writing data. Moreover, since variation in the direction of the electric field formed in the portion of the ferroelectric film disposed above or below the insulating film can be reduced, a larger effect can be attained when the ferroelectric film is made of monocrystal.

In the first semiconductor memory of the invention, the insulating film is preferably made of a ferroelectric substance.

Thus, since the ferroelectric substance exhibits a high insulating property, the leakage characteristic of the semiconductor memory is improved. Also, since a ferroelectric substance has a high dielectric constant, an electric field is formed comparatively vertically to the interface between the ferroelectric film and the insulating film for conducting the carriers as described above, and hence, the aforementioned effect can be also attained.

The second semiconductor memory of this invention includes a gate electrode formed on a semiconductor substrate; a first device having a first source electrode and a first drain electrode spaced from each other and electrically connected to a channel controlled by the gate electrode; a conducting film formed on a first insulating film covering the first device; a multilayered structure formed on the conducting film and including a ferroelectric film and a second insulating film; and a second device having a second source electrode and a second drain electrode formed in positions for applying a current to an interface between the ferroelectric film and the second insulating film, and the first source electrode is electrically connected to the second source electrode, and the first drain electrode is electrically connected to the second drain electrode.

According to the second semiconductor memory of this invention, a memory cell capable of writing/reading data and composed of the first device having a structure of, for example, a transistor and the second device having a structure of, for example, an interface conducting device is provided. In the case where this memory cell is provided in the form of an array, a semiconductor memory in which data read can be uniquely determined and the disturb problem can be prevented is realized.

In the second semiconductor memory of the invention, the first device is preferably disposed below the second device.

In this case, in a plane layout, the first device and the second device are arranged so that a region where the first device is formed can overlap a region where the second device is formed, and therefore, the cell area of the memory cell composed of the first device and the second device can be reduced.

The second semiconductor memory of the invention preferably further includes a memory cell array in which memory cells each composed of the first device and the second device are arranged in the form of a matrix along a bit line direction and a word line direction, and in each memory cell group disposed along the bit line direction in the memory cell array, memory cells adjacent to each other along the bit line direction share the first source electrode or the first drain electrode.

Thus, the semiconductor memory can attain a structure in which the disturb problem that polarization of a memory cell not accessed is reduced when the memory cell is provided in the form of an array can be avoided. Furthermore, when the memory cell is provided in the form of an array, a part of the cell area of each memory cell can be shared with another adjacent memory cell, and therefore, the cell area of the whole of a plurality of memory cells arranged in the form of an array can be reduced.

The second semiconductor memory of the invention preferably further includes a memory cell array in which memory cells each composed of the first device and the second device are arranged in the form of a matrix along a bit line direction and a word line direction, in each memory cell group disposed along the bit line direction in the memory cell array, memory cells adjacent to each other along the bit line direction share the second source electrode or the second drain electrode.

Thus, the semiconductor memory can attain a structure in which the disturb problem that polarization of a memory cell not accessed is reduced when the memory cell is provided in the form of an array can be avoided. Furthermore, when the memory cell is provided in the form of an array, a part of the cell area of each memory cell can be shared with another adjacent memory cell, and therefore, the cell area of the whole of a plurality of memory cells arranged in the form of an array can be reduced.

The driving method for a semiconductor memory of this invention is a driving method for a semiconductor memory having a memory cell array in which a plurality of memory cells are arranged on a semiconductor substrate in the form of a matrix along a bit line direction and a word line direction, and each of the plurality of memory cells includes a first device having a gate electrode formed on the semiconductor substrate and a first source electrode and a first drain electrode spaced from each other and electrically connected to a channel controlled by the gate electrode; and a second device having, on the semiconductor substrate, a conducting film formed on a first insulating film covering the first device, a multilayered structure formed on the conducting film and including a ferroelectric film and a second insulating film, a second source electrode formed in a position for applying a current to an interface between the ferroelectric film and the second insulating film and electrically connected to the first source electrode, and a second drain electrode electrically connected to the first drain electrode, and memory cells adjacent to each other along the bit line direction in each memory cell group disposed along the bit line direction in the memory cell array share the first source electrode or the first drain electrode and share the second source electrode or the second drain electrode, and the driving method includes the steps of (a) grounding the gate electrode of a memory cell selected for a data write or read operation from the plurality of memory cells; and (b) applying a voltage to the gate electrode of a memory cell not selected for the data write or read operation from the plurality of memory cells.

In the driving method for a semiconductor memory of this invention, a voltage is applied to a gate electrode of a second device, for example, a transistor of a memory cell not selected for a data write or read operation and a gate electrode of a second device, for example, a transistor of a memory cell selected for the data write or read operation is grounded. Thus, in a data write operation, a desired voltage can be applied merely to ferroelectric capacity of a first device of the selected memory cell without applying a slight voltage to ferroelectric capacity of a first device of the memory cell not selected for the read operation. Therefore, the data read can be uniquely performed in the data read operation.

In the driving method for a semiconductor memory of the invention, the plurality of memory cells are preferably provided with a bit line for connecting the first drain electrode and the second drain electrode in each memory cell group disposed along the bit line direction, the conducting film is preferably a source line for connecting the second source electrodes to one another in each memory cell group disposed along the word line direction, and the driving method preferably further includes, after the steps (a) and (b), steps of (c)

applying, to the bit line, a voltage corresponding to data to be written; and (d) applying a pulse voltage to the source line after the step (c).

In the driving method for a semiconductor memory of the invention, the plurality of memory cells are preferably provided with a bit line for connecting the first drain electrode and the second drain electrode in each memory cell group disposed along the bit line direction, the conducting film is preferably a source line for connecting the source electrodes to one another in each memory cell group disposed along the word line direction, and the driving method preferably further includes, after the steps (a) and (b), steps of (e) applying a pulse voltage to the source line; and (f) detecting a voltage appearing on the bit line after the step (e).

As described so far, the present invention provides a ferroelectric memory using carrier conduction on an interface between an insulating film and a ferroelectric film that can be comparatively easily designed. Furthermore, the ferroelectric memory has a structure good for refinement. Moreover, the present invention provides a memory cell capable of writing/reading data and including a transistor and an interface conducting device. When this memory cell is provided in the form of an array, a semiconductor memory in which data read can be uniquely determined and the disturb problem can be prevented is realized.

BRIEF DESCRIPTION OF THE DRAWINGS

FIG. 11A is the waveform used in a write operation and FIG. 11B is the waveform used in a read operation;

DETAILED DESCRIPTION OF THE INVENTION

Preferred embodiments of the invention will now be described with reference to the accompanying drawings.

Embodiment 1

A semiconductor memory and a method for fabricating the same according to Embodiment 1 of the invention will now be described with reference to FIGS. 1A and 1B.

Figure 1A:
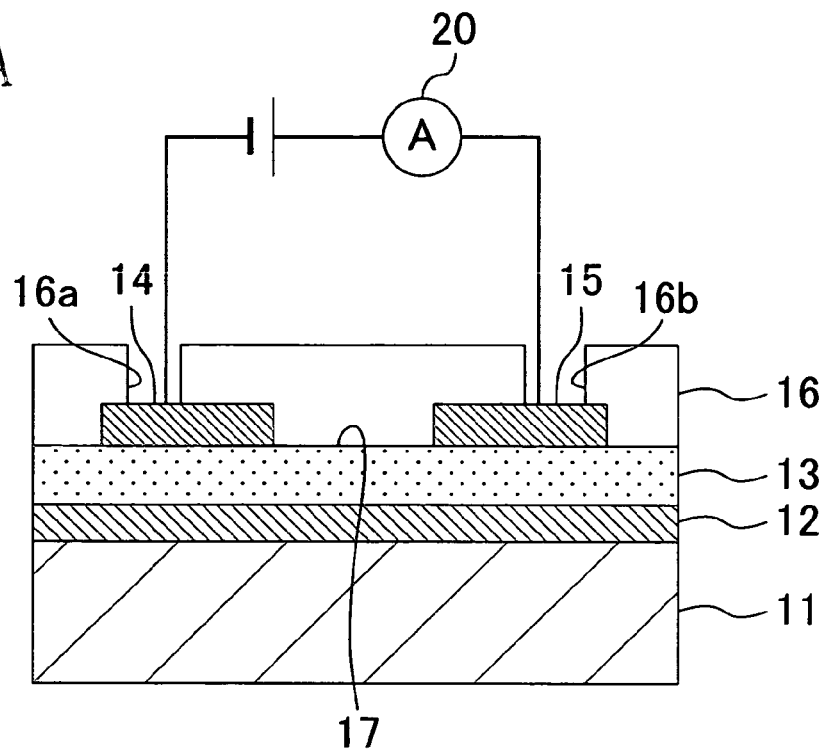
FIGS. 1A and 1B are cross-sectional views for showing the structural concept of a principal part of a semiconductor memory according to Embodiment 1 of the invention, and specifically, FIG. 1A also shows a configuration for reading data and FIG. 1B also shows a configuration for writing data and a conceptual diagram of electric flux lines caused in a ferroelectric film.
Figure 1B:
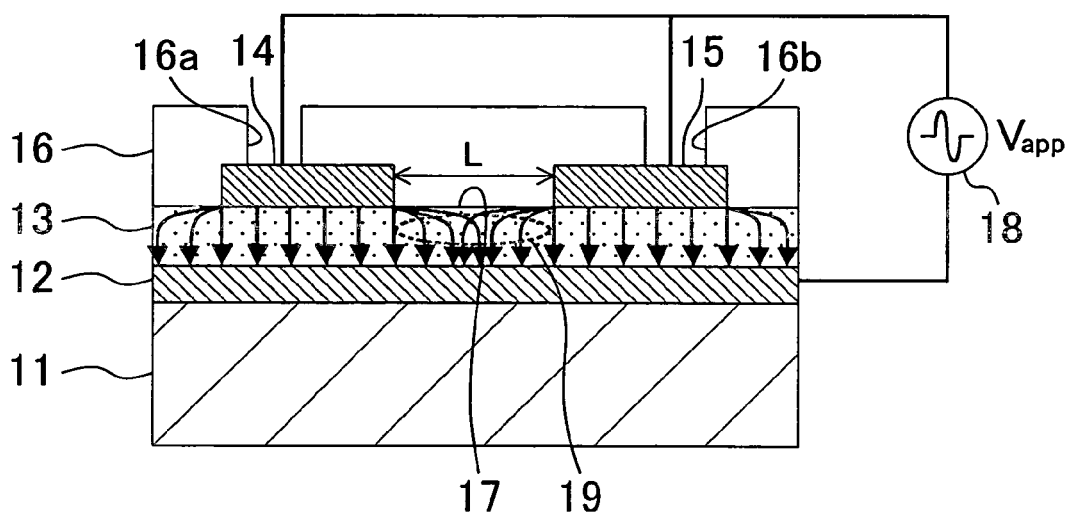

FIGS. 1A and 1B are cross-sectional views for showing the structural concept of the semiconductor memory of Embodiment 1 of the invention, and FIG. 1A also shows a configuration for reading data and FIG. 1B also shows a configuration for writing data and a conceptual diagram of electric flux lines caused in a ferroelectric film.

Structure of Semiconductor Memory of Embodiment 1

As shown in FIGS. 1A and 1B, a lower electrode 12 made of a conducting film and a ferroelectric film 13 are stacked in this order in the upward direction on a substrate 11. A source electrode 14 and a drain electrode 15 both made of a conducting film and spaced from each other are formed on the ferroelectric film 13. Also, an insulating film 16 is formed on the ferroelectric film 13 so as to cover the source electrode 14 and the drain electrode 15, a first contact hole 16a for exposing the top face of the source electrode 14 is formed in the insulating film 16 so that a voltage can be applied to the source electrode 14, and a second contact hole 16b for exposing the top face of the drain electrode 15 is formed in the insulating film 16 so that a voltage can be applied to the drain electrode 15. In this manner, the lower electrode 12 is disposed to oppose the source electrode 14 and the drain electrode 15 with the ferroelectric film 13 sandwiched therebetween. Also, the source electrode 14 and the drain electrode 15 are disposed to be in contact with an interface 17 between the ferroelectric film 13 and the insulating film 16 and to oppose each other with the interface 17 sandwiched therebetween. Thus, the source electrode 14 and the drain electrode 15 together construct an electrode pair for detecting the degree of conductivity of carriers on the interface 17, namely, for detecting an interface current.

Fabrication Method for Semiconductor Memory of Embodiment 1

First, as shown in FIGS. 1A and 1B, after forming a lower electrode 12 made of a conducting film on a substrate 11, a ferroelectric film 13 is formed on the lower electrode 12. Next, a source electrode 14 and a drain electrode 15 both made of a conducting film are formed on the ferroelectric film 13 so as to be spaced from each other. Then, after depositing an insulating film 16 on the ferroelectric film 13 so as to cover the source electrode 14 and the drain electrode 15, a first contact hole 16a for exposing the top face of the source electrode 14 and a second contact hole 16b for exposing the top face of the drain electrode 15 are formed in the insulating film 16 so that voltages can be applied respectively to the source electrode 14 and the drain electrode 15.

In this fabrication method, the material for the substrate 1 is not particularly specified, and for example, Si, SiO$_2$ or SrTiO$_3$ is generally used and any insulating material may be used.

Furthermore, as a method for depositing the conducting film used as the lower electrode 12, spattering, EB deposition, MOCVD, laser abrasion, PLD or the like may be employed.

As the material for the conducting film used as the lower electrode 12, a metal having a higher work function than the ferroelectric film 13 is preferably used in consideration of the leakage characteristic of the ferroelectric film 13. Also, as the material for the conducting film used as the lower electrode 12, Pt, Ir, IrO$_x$, Au, RuO$_x$ or the like is preferably used so that the ferroelectric film 13 can attain a high polarization inversion fatigue characteristic.

As a method for forming the ferroelectric film 13 and the insulating film 16, the sputtering, the MOCVD, the laser abrasion, the PLD, MOD, a sol-gel method or the like may be employed. Also, the insulating film 16 is formed on the ferroelectric film 13 preferably in such a manner that the interface 17 between the ferroelectric film 13 and the insulating film 16 can be clean.

Furthermore, a portion of the ferroelectric film 13 disposed below the interface 17 preferably includes monocrystal. Thus, the influence of electrons trapped in grain boundaries can be avoided, and hence, the change in the conductivity of the carriers on the interface 17 can be stabilized.

Moreover, the ferroelectric film 13 and the insulating film 16 are preferably heteroepitaxially-grown.

Furthermore, in the portion of the ferroelectric film 13 disposed below the interface 17, the direction of an electric field and the direction of crystal grains of the ferroelectric film 13 preferably accord with each other. Thus, the polarization of the ferroelectric film 13 can be inverted with a minimum electric field. Specifically, on the interface 17 between the ferroelectric film 13 and the insulating film 16 used for conducting the carriers, an electric field is formed obliquely or parallel to the interface 17, and therefore, the ferroelectric film 13 is preferably formed so as to make the polarization direction of the crystal grains included in the portion of the ferroelectric film 13 disposed below the interface 17 oblique or parallel to the interface 17.

As the material for the ferroelectric film 13, for example, SBT (SrBi$_2$Ta$_2$O$_9$), SBTN (SrBi$_2$(Ta, Nb)$_2$O$_9$), BLT (Bi, La)$_4$Ti$_3$O$_{12}$), BiFeO$_3$, PbTiO$_3$, PZT (Pb(Zr, Ti)O$_3$), PLZT ((Pb, La)(Zr, Ti)O$_3$), BaTiO$_3$, LiNbO$_3$ or SrTiO$_3$ may be used.

Furthermore, as the material for the insulating film 16, a material with a high insulating property is preferably used for preventing a leakage current caused between the source electrode 14 and the drain electrode 15. For example, SiO$_2$, SiON, PGS (phospho-silicate-glass), BPGS (boro-phospho-silicate-glass), HfO$_x$ or SrTiO$_3$ may be used. In particular, HfO$_x$ is preferred because it has a high dielectric constant and a high melting point.

Moreover, as the material for the conducting film used as the source electrode 14 and the material for the conducting film used as the drain electrode 15, similarly to the selection of the material for the conducting film used as the lower electrode 12, a metal with a higher work function than the ferroelectric film 13 is preferably selected from the viewpoint of the leakage characteristic of the ferroelectric film 13, and Pt, Ir, IrO$_x$, Au, RuO$_x$ or the like is preferably selected from the viewpoint of the polarization inversion fatigue characteristic of the ferroelectric film 13. Furthermore, for depositing the conducting film used as the source electrode 14 and the conducting film used as the drain electrode 15, a method in which the interface between the ferroelectric film 13 and the insulating film 16 can be kept clean is preferably employed.

Operation of Semiconductor Memory of Embodiment 1

<Data Write Operation>

In the semiconductor memory of this embodiment shown in FIGS. 1A and 1B, a data write operation is performed by applying a positive or negative voltage between the source and drain electrodes 14 and 15 and the lower electrode 12 so as to apply a positive or negative electric field for inducing spontaneous polarization in the ferroelectric film 13. For example, in FIG. 1B, a power source 18 (a voltage V$_{app}$) is used to form a downward electric field between the source and drain electrodes 14 and 15 and the lower electrode 12. Specifically, a vertical downward electric field is formed between the source electrode 14 and the lower electrode 12 and between the drain electrode 15 and the lower electrode 12, and in a portion of the ferroelectric film 13 sandwiched between the source electrode 14 and the drain electrode 15, namely, in the portion of the ferroelectric film 13 disposed directly below the interface 17, an electric field 19 extending curvedly downward from each end of the source electrode 14 and the drain electrode 15 (hereinafter referred to as the extruded electric field 19) is formed. Since the extruded electric field 19 is formed in the portion of the ferroelectric film 13 disposed directly below the interface 17, data can be written by causing the polarization inversion in the portion of the ferroelectric film 13 disposed directly below the interface 17. At this point, in order to cause the polarization inversion in the portion of the ferroelectric film 13 disposed directly below the interface 17, a distance L between the source electrode 14 and the drain electrode 15 and the voltage V$_{app}$ are adjusted.

<Data Read Operation>

On the other hand, a data read operation is performed in a nonerasable manner by detecting the conducting state of a channel, which is different depending upon the direction of the polarization of the ferroelectric film 13. Specifically, as described with respect to the data write operation, since the polarization inversion is caused in the portion of the ferroelectric film 13 disposed directly below the interface 17 by the extruded electric field 19, free charges of electrons or holes are generated on the interface 17 between the ferroelectric film 13 and the insulating film 16. The free charges are largely changed depending upon the direction of the polarization of the ferroelectric film 13 and hence can be used for determining whether the polarization direction of the ferroelectric film 13 is upward or downward. In the case where the polarization direction of the ferroelectric film 13 is upward, the number of movable electrons present on the interface 17 between the ferroelectric film 13 and the insulating film 16 is small and hence the electric conductivity of the channel is small. In the case where it is downward, the number of movable electrons present on the interface 17 between the ferroelectric film 13 and the insulating film 16 is large and hence the electric conductivity of the channel is large, and therefore, an interface current (channel current) passes through the interface 17 between the ferroelectric film 13 and the insulating film 16. Accordingly, data is read by, for example, as shown in FIG. 1A, using an ammeter 20 connected between the source electrode 14 and the drain electrode 15 for detecting the interface current on the interface 17 between the ferroelectric film 13 and the insulating film 16.

In this embodiment, when a voltage is applied between the lower electrode 12 and the source and drain electrodes 14 and 15, the extruded electric field 19 generated from each end or the like of the source electrode 14 and the drain electrode 15 is formed in the portion of the ferroelectric film 13 disposed directly below the interface 17. Therefore, the polarization inversion caused in this portion can be used for writing data, and the conductivity of carriers on the interface 17 between the ferroelectric film 13 and the insulating film 16, which is changed in accordance with the polarization inversion in this portion, can be detected for reading data. Furthermore, in the structure of this embodiment, the voltage application necessary for writing data is performed on a single layer of the ferroelectric film 13, and hence, there is no restriction in devise design as in the conventional technique and the design freedom is improved. Also, in the structure of this embodiment, the voltage necessary for writing data can be applied by using the lower electrode 12 and at least one of the source electrode 14 and the drain electrode 15 and there is no need to use a gate electrode as in the conventional technique, and therefore, the structure of this embodiment is good for refinement of the semiconductor memory.

Embodiment 2

A semiconductor memory and a method for fabricating the same according to Embodiment 2 of the invention will now be described with reference to FIGS. 2A and 2B.

Figure 2A:
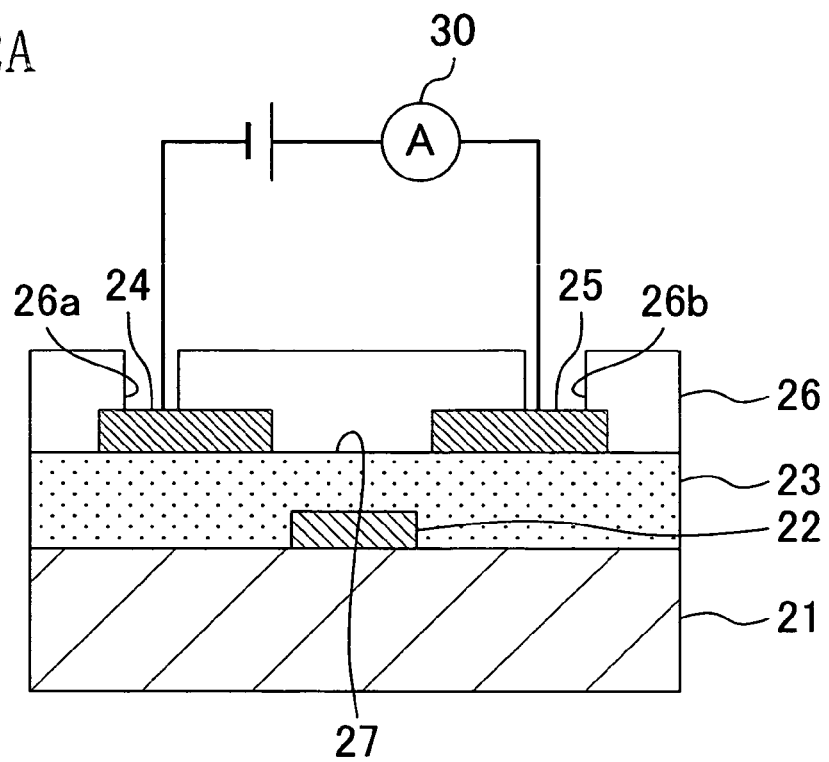
FIGS. 2A and 2B are cross-sectional views for showing the structural concept of a principal part of a semiconductor memory according to Embodiment 2 of the invention, and specifically, FIG. 2A also shows a configuration for reading data and FIG. 2B also shows a configuration for writing data and a conceptual diagram of electric flux lines caused in a ferroelectric film.
Figure 2B:
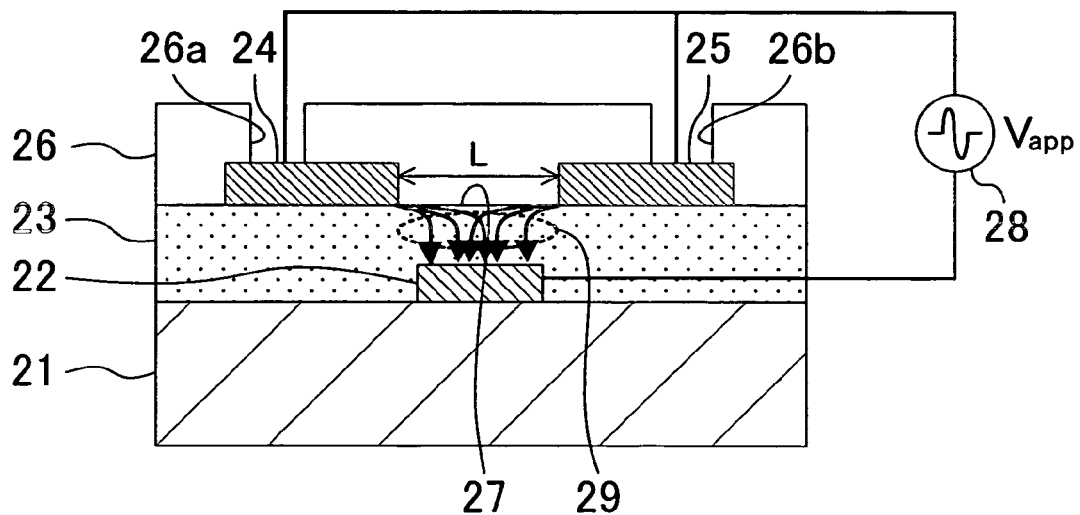

FIGS. 2A and 2B are cross-sectional views for showing the structural concept of the semiconductor memory of Embodiment 2 of the invention, and FIG. 2A also shows a configuration for reading data and FIG. 2B also shows a configuration for writing data and a conceptual diagram of electric flux lines caused in a ferroelectric film.

Structure of Semiconductor Memory of Embodiment 2

As shown in FIGS. 2A and 2B, a lower electrode 22 made of a conducting film is formed on a substrate 21 and a ferroelectric film 23 is formed so as to cover the lower electrode 22. A source electrode 24 and a drain electrode 25 both made of a conducting film and spaced from each other are formed on the ferroelectric film 23. Also, an insulating film 26 is formed on the ferroelectric film 23 so as to cover the source electrode 24 and the drain electrode 25, a first contact hole 26a for exposing the top face of the source electrode 24 is formed in the insulating film 26 so that a voltage can be applied to the source electrode 24, and a second contact hole 26b for exposing the top face of the drain electrode 25 is formed in the insulating film 26 so that a voltage can be applied to the drain electrode 25. The source electrode 24 and the drain electrode 25 are disposed to be in contact with an interface 27 between the ferroelectric film 23 and the insulating film 26 and to oppose each other with the interface 27 sandwiched therebetween. Thus, the source electrode 24 and the drain electrode 25 together construct an electrode pair for detecting the degree of conductivity of carriers on the interface 27, namely, for detecting an interface current.

In the semiconductor memory of this embodiment, as shown in FIGS. 2A and 2B, the lower electrode 22 is formed below a portion sandwiched between the source electrode 24 and the drain electrode 25, namely, the lower electrode 22 is selectively formed to be included in a unit device forming region composed of a region where the source electrode 24 is formed, a region where the drain region 25 is formed and a region sandwiched between the source electrode 24 and the drain electrode 25. This is a characteristic of this embodiment different from Embodiment 1.

Fabrication Method for Semiconductor Memory of Embodiment 2

First, as shown in FIGS. 2A and 2B, a lower electrode 22 made of a conducting film is formed on a substrate 21. Then, a ferroelectric film 23 is formed on the substrate 21 so as to cover the lower electrode 22. Next, a source electrode 24 and a drain electrode 25 both made of a conducting film are formed on the ferroelectric film 23 so as to be spaced from each other. Then, after depositing an insulating film 26 on the ferroelectric film 23 so as to cover the source electrode 24 and the drain electrode 25, a first contact hole 26a for exposing the top face of the source electrode 24 and a second contact hole 26b for exposing the top face of the drain electrode 25 are formed in the insulating film 26 so that voltages can be applied respectively to the source electrode 24 and the drain electrode 25.

In the method for fabricating a semiconductor memory of this embodiment, in the procedure for forming the lower electrode 22, the conducting film deposited on the substrate 21 is patterned by dry etching or lift-off so that the lower electrode 22 can be disposed below the portion sandwiched between the source electrode 24 and the drain electrode 25 subsequently formed. This is a characteristic of this embodiment different from Embodiment 1. Accordingly, the lower electrode 22 is selectively formed so as to be included in the unit device forming region composed of the region where the source electrode 24 is formed, the region where the drain electrode 25 is formed and the region sandwiched between the source electrode 24 and the drain electrode 25.

It is noted that methods for forming films and materials, etc. to be employed in the semiconductor memory and the fabrication method for the same of this embodiment are the same as those described in Embodiment 1.

Operation of Semiconductor Memory of Embodiment 2

<Data Write Operation>

In the semiconductor memory of this embodiment shown in FIGS. 2A and 2B, a data write operation is performed by inducing spontaneous polarization in the ferroelectric film 23 by using an extruded electric field 29 formed by applying a positive or negative voltage between the source and drain electrodes 24 and 25 and the lower electrode 22. For example, in FIG. 2B, a power source 28 (a voltage $V_{app}$) is used to form the extruded electric field 29 extending curvedly downward from each end of the source electrode 24 and the drain electrode 25 toward the top face of the lower electrode 22. Since the extruded electric field 29 is formed in a portion of the ferroelectric film 23 disposed directly below the interface 27, data can be written by causing the polarization inversion in the portion of the ferroelectric film 23 disposed directly below the interface 27. At this point, in order to cause the polarization inversion in the portion of the ferroelectric film 23 disposed directly below the interface 27, a distance L between the source electrode 24 and the drain electrode 25 and the voltage $V_{app}$ are adjusted.

In this embodiment, the lower electrode 22 is patterned to be disposed below the portion sandwiched between the source electrode 24 and the drain electrode 25 and is not formed below the region where the source electrode 24 is formed and the region where the drain electrode 25 is formed. In other words, the lower electrode 22 opposes neither the source electrode 24 nor the drain electrode 25, and in a plan view, the region where the lower electrode 22 is disposed does not overlap the regions where the source electrode 24 and the drain electrode 25 are formed. Therefore, even when a large electric field is applied between the lower electrode 22 and at least one of the source electrode 24 and the drain electrode 25, a direct electric field (such as the electric field formed between the opposing electrodes in Embodiment 1) is never applied to the ferroelectric film 23. As a result, it is possible to reduce risk of dielectric breakdown and a leakage current of the ferroelectric film 23.

<Data Read Operation>

On the other hand, a data read operation is performed in a nonerasable manner by detecting the conducting state of a channel, which is different depending upon the direction of the polarization of the ferroelectric film 23. Specifically, as described with respect to the data write operation, since the polarization inversion is caused in the portion of the ferroelectric film 23 disposed directly below the interface 27 by the extruded electric field 29, free charges of electrons or holes are generated on the interface 27 between the ferroelectric film 23 and the insulating film 26. The free charges are largely changed depending upon the direction of the polarization of the ferroelectric film 23 and hence can be used for determining whether the polarization direction of the ferroelectric film 23 is upward or downward. Specifically, the read operation is performed in the same manner as in Embodiment 1. In this embodiment, data is ready by, for example, as shown in FIG. 2A, using an ammeter 30 connected between the source electrode 24 and the drain electrode 25 for detecting an interface current on the interface 27 between the ferroelectric film 23 and the insulating film 26.

Embodiment 3

A semiconductor memory and a method for fabricating the same according to Embodiment 3 of the invention will now be described with reference to FIGS. 3A and 3B.

Figure 3A:
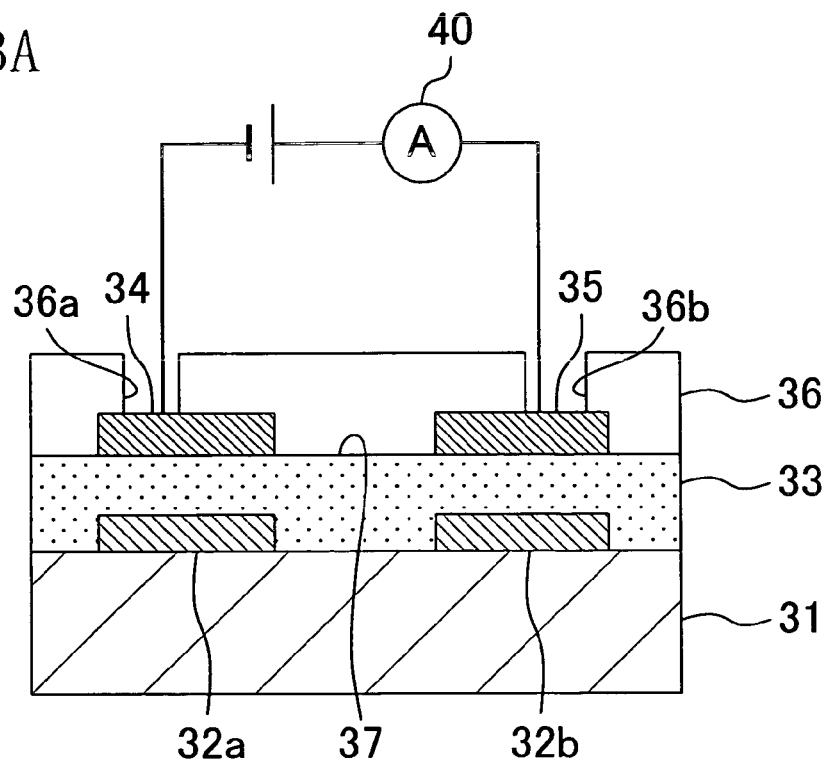
FIGS. 3A and 3B are cross-sectional views for showing the structural concept of a principal part of a semiconductor memory according to Embodiment 3 of the invention, and specifically, FIG. 3A also shows a configuration for reading data and FIG. 3B also shows a configuration for writing data and a conceptual diagram of electric flux lines caused in a ferroelectric film.
Figure 3B:
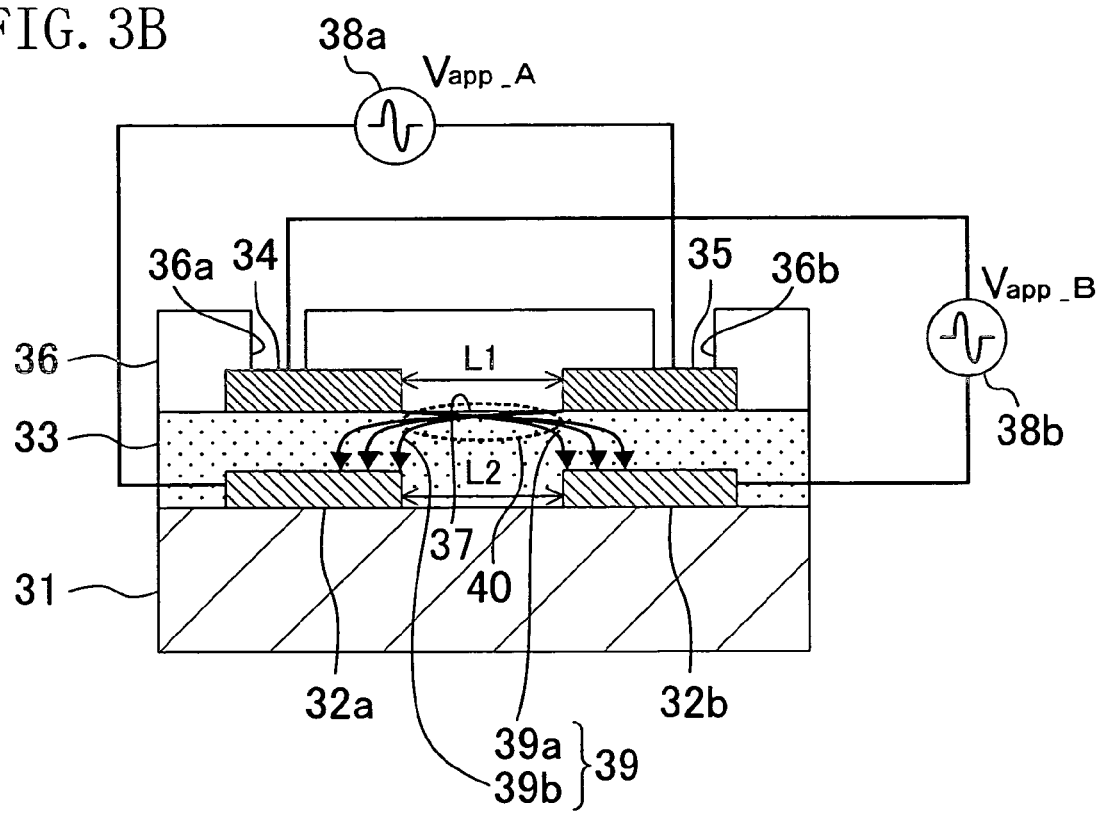

FIGS. 3A and 3B are cross-sectional views for showing the structural concept of the semiconductor memory of Embodiment 3 of the invention, and FIG. 3A also shows a configuration for reading data and FIG. 3B also shows a configuration for writing data and a conceptual diagram of electric flux lines caused in a ferroelectric film.

Structure of Semiconductor Memory of Embodiment 3

As shown in FIGS. 3A and 3B, lower electrodes 32a and 32b made of a conducting film and spaced from each other are formed on a substrate 31 and a ferroelectric film 33 is formed so as to cover the lower electrodes 32a and 32b. A source electrode 34 and a drain electrode 35 both made of a conducting film and spaced from each other are formed on the ferroelectric film 33. Also, an insulating film 36 is formed on the ferroelectric film 33 so as to cover the source electrode 34 and the drain electrode 35, a first contact hole 36a for exposing the top face of the source electrode 34 is formed in the insulating film 36 so that a voltage can be applied to the source electrode 34, and a second contact hole 36b for exposing the top face of the drain electrode 35 is formed in the insulating film 36 so that a voltage can be applied to the drain electrode 35. The source electrode 34 and the drain electrode 35 are disposed to be in contact with an interface 37 between the ferroelectric film 33 and the insulating film 36 and to oppose each other with the interface 37 sandwiched therebetween. Thus, the source electrode 34 and the drain electrode 35 together construct an electrode pair for detecting the degree of conductivity of carriers on the interface 37, namely, for detecting an interface current.

In the semiconductor memory of this embodiment, as shown in FIGS. 3A and 3B, the lower electrode 32a and the source electrode 34 are formed to oppose each other with the ferroelectric film 33 sandwiched therebetween, and the lower electrode 32b and the drain electrode 35 are formed to oppose each other with the ferroelectric film 33 sandwiched therebetween. This is a characteristic of this embodiment different from Embodiment 1. It is noted that the lower electrodes 32a and 32b are formed in a unit device forming region in the same manner as in Embodiment 2.

Fabrication Method for Semiconductor Memory of Embodiment 3

First, as shown in FIGS. 3A and 3B, lower electrodes 32a and 32b made of a conducting film and spaced from each other are formed on a substrate 31. Then, a ferroelectric film 33 is formed on the substrate 31 so as to cover the lower electrodes 32a and 32b. Next, a source electrode 34 and a drain electrode 35 both made of a conducting film are formed on the ferroelectric film 33 so as to be spaced from each other. Then, after depositing an insulating film 36 on the ferroelectric film 33 so as to cover the source electrode 34 and the drain electrode 35, a first contact hole 36a for exposing the top face of the source electrode 34 and a second contact hole 36b for exposing the top face of the drain electrode 35 are formed in the insulating film 36 so that voltages can be applied respectively to the source electrode 34 and the drain electrode 35.

In the method for fabricating a semiconductor memory of this embodiment, the source electrode 34 is formed by patterning the conducting film by the dry etching or the lift-off so as to oppose the lower electrode 32a with the ferroelectric film 33 sandwiched therebetween, and the drain electrode 35 is formed by patterning the conducting film by the dry etching or the lift-off so as to oppose the lower electrode 32b with the ferroelectric film 33 sandwiched therebetween. This is a characteristic of this embodiment different from Embodiment 1.

It is noted that methods for forming films and materials, etc. to be employed in the semiconductor memory and the fabrication method for the same of this embodiment are the same as those described in Embodiment 1, and the lower electrodes 32a and 32b are formed in the unit device forming region in the same manner as in Embodiment 2.

Operation of Semiconductor Memory of Embodiment 3

<Data Write Operation>

In the semiconductor memory of this embodiment shown in FIGS. 3A and 3B, a data write operation is performed by inducing spontaneous polarization in the ferroelectric film 33 by using an extruded electric field 39 formed by applying a positive or negative voltage between the source and drain electrodes 34 and 35 and the lower electrodes 32a and 32b. For example, in FIG. 3B, the extruded electric field 39 composed of a first extruded electric field 39a formed by using a power source 38a (a voltage $V_{app\_A}$) and extending curvedly from each end of the source electrode 34 toward the top face of the lower electrode 32b and a second extruded electric field 39b formed by using a power source 38b (a voltage $V_{app\_B}$) and extending curvedly from each end of the drain electrode 35 toward the top face of the lower electrode 32a is formed. Since the extruded electric field 39 is thus formed in a portion of the ferroelectric film 33 disposed directly below the interface 37, data can be written by causing the polarization inversion in the portion of the ferroelectric film 33 disposed directly below the interface 37. At this point, in order to cause the polarization inversion in the portion of the ferroelectric film 33 disposed directly below the interface 37, a distance L1 between the source electrode 34 and the drain electrode 35, a distance L2 between the lower electrode 32a and the lower electrode 32b and the voltages $V_{app\_A}$ and $V_{app\_B}$ are adjusted. Although the extruded electric field 39 is formed by using the power sources 38a and 38b in this embodiment, one of these power sources may be used for causing the polarization inversion in the portion of the ferroelectric film 33 disposed directly below the interface 37.

In this embodiment, when a voltage is applied at least between the source electrode 34 and the lower electrode 32b or between the drain electrode 35 and the lower electrode 32a, the electric field can be efficiently formed selectively in the portion of the ferroelectric film 33 disposed directly below the interface 37 so as to cause the polarization inversion.

Also, the first extruded electric field 39a is formed from each end of the source electrode 34 toward the top face of the lower electrode 32b by applying the voltage between the source electrode 34 and the lower electrode 32b and the second extruded electric field 39b is formed from each end of the drain electrode 35 toward the top face of the lower electrode 32a by applying the voltage between the drain electrode 35 and the lower electrode 32a. On the other hand, no direct electric field is applied to the ferroelectric film 33 in the same manner as in Embodiment 2. Therefore, the risk of the dielectric breakdown and a leakage current of the ferroelectric film 33 can be reduced.

<Data Read Operation>

On the other hand, a data read operation is performed in a nonerasable manner by detecting the conducting state of a channel, which is different depending upon the direction of the polarization of the ferroelectric film 33. Specifically, as described with respect to the data write operation, since the polarization inversion is caused in the portion of the ferroelectric film 33 disposed directly below the interface 37 by the extruded electric field 39, free charges of electrons or holes are generated on the interface 37 between the ferroelectric film 33 and the insulating film 36. The free charges are largely changed depending upon the direction of the polarization of the ferroelectric film 33 and hence can be used for determining whether the polarization direction of the ferroelectric film 33 is upward or downward. Specifically, the read operation is performed in the same manner as in Embodiment 1. In this embodiment, data is read by, for example, as shown in FIG. 3A, using an ammeter 40 connected between the source electrode 34 and the drain electrode 35 for detecting an interface current on the interface 37 between the ferroelectric film 33 and the insulating film 36.

Embodiment 4

A semiconductor memory and a method for fabricating the same according to Embodiment 4 of the invention will now be described with reference to FIG. 4.

Figure 4:
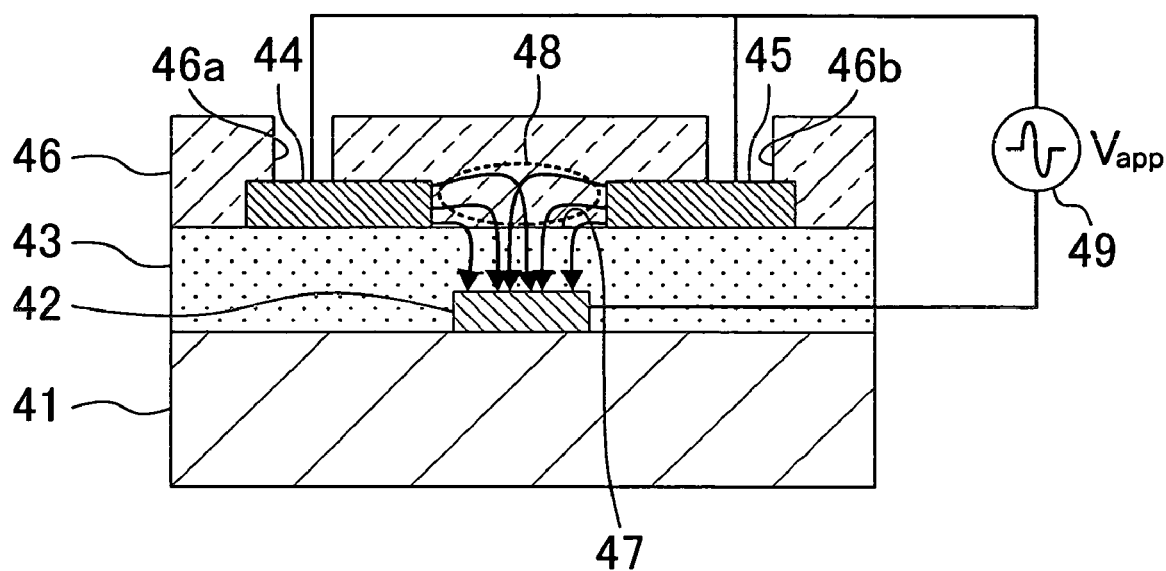
FIG. 4 is a cross-sectional view for showing the structure concept of a principal part of a semiconductor memory according to Embodiment 4 of the invention, which also shows a configuration for writing data and a conceptual diagram of electric flux lines caused in a ferroelectric film.

FIG. 4 is a cross-sectional view for showing the structural concept of the semiconductor memory of Embodiment 4 of the invention, and also shows a configuration for writing data and a conceptual diagram of electric flux lines caused in a ferroelectric film.

Structure of Semiconductor Memory of Embodiment 4

As shown in FIG. 4, a lower electrode 42 made of a conducting film is formed on a substrate 41 and a ferroelectric film 43 is formed so as to cover the lower electrode 42. A source electrode 44 and a drain electrode 45 both made of a conducting film and spaced from each other are formed on the ferroelectric film 43. Also, a high dielectric constant insulating film 46 having a high dielectric constant is formed on the ferroelectric film 43 so as to cover the source electrode 44 and the drain electrode 45, a first contact hole 46a for exposing the top face of the source electrode 44 is formed in the high dielectric constant insulating film 46 so that a voltage can be applied to the source electrode 44, and a second contact hole 46b for exposing the top face of the drain electrode 45 is formed in the high dielectric constant insulating film 46 so that a voltage can be applied to the drain electrode 45. The source electrode 44 and the drain electrode 45 are disposed to be in contact with an interface 47 between the ferroelectric film 43 and the high dielectric constant insulating film 46 and to oppose each other with the interface 47 sandwiched therebetween. Thus, the source electrode 44 and the drain electrode 45 together construct an electrode pair for detecting the degree of conductivity of carriers on the interface 47, namely, for detecting an interface current. In this manner, the semiconductor memory of this embodiment is different from that of Embodiment 2 in the high dielectric constant insulating film 46 provided instead of the insulating film 26 of Embodiment 2, and the rest of the structure and the resultant effects are the same as those of Embodiment 2.

A fabrication method for the semiconductor memory of this embodiment is the same as that of Embodiment 2, and is characterized by the high dielectric constant insulating film 46 formed instead of the insulating film 26 of FIGS. 2A and 2B.

As the material for the high dielectric constant insulating film 46, a low dielectric constant material such as $SiO_2$ is not preferred but a material having a high dielectric constant such as $HfO_x$ is preferred, and a material having a higher dielectric constant than the ferroelectric film 43 is more preferred. For example, in the case where the ferroelectric film 43 is made of SBT, this ferroelectric film 43 has a dielectric constant of approximately 550 at room temperature, and hence, the high dielectric constant insulating film 46 is preferably made of a high dielectric constant material having a higher dielectric constant, such as $SrBi_2Nb_2O_9$ (with a dielectric constant of approximately 1100), $PbBi_2Nb_2O_9$ (with a dielectric constant of approximately 2100), $Bi_4Ti_3O_{12}$ (with a dielectric constant of approximately 1700), $SrBi_4Ti_4O_{15}$ (with a dielectric constant of approximately 1600) or $PbBi_4Ti_4O_{15}$ (with a dielectric constant of approximately 5500).

Alternatively, a ferroelectric material is preferably used as the material for the high dielectric constant insulating film 46. In particular, a ferroelectric material exhibits a very high insulating property and can realize a higher dielectric constant than the ferroelectric film 43. In the case where the high dielectric constant insulating film 46 is made of a ferroelectric material, in order to prevent the conducting behavior of the carriers on the interface 47 from being changed by its ferroelectric property, a ferroelectric material having a larger coercive electric field than the ferroelectric film 43 is preferably used. Alternatively, its ferroelectric property is preferably positively utilized, and the conducting film is formed also on the high dielectric constant insulating film 46 as disclosed in Japanese Laid-Open Patent Publication No. 2003-332538 for applying the electric field to the high dielectric constant insulating film 46 and the ferroelectric film 43, so as to control a channel formed on the interface 47 to amplify.

Operation of Semiconductor Memory of Embodiment 4

In the semiconductor memory of this embodiment shown in FIG. 4, a data write operation is performed by inducing spontaneous polarization in the ferroelectric film 43 by using an extruded electric field 48 formed by applying a positive or negative voltage between the source and drain electrodes 44 and 45 and the lower electrode 42. For example, in FIG. 4, a power source 49 (a voltage $V_{app}$) is used to form the extruded electric field 48 extending curvedly downward from each end of the source electrode 44 and the drain electrode 45 toward the top face of the lower electrode 42. Since the semiconductor memory of this embodiment includes the high dielectric constant insulating film 46 having a high dielectric constant, the electric field is extruded not only from the ends of the source electrode 44 and the drain electrode 45 but also from the side faces thereof as shown in FIG. 4, and the electric flux lines are drawn to detour in the high dielectric constant insulating film 46. Since the extruded electric field 48 is thus formed comparatively vertically in a portion of the ferroelectric film 43 disposed directly below the interface 47, the portion of the ferroelectric film 43 disposed directly below the interface 47 where the polarization direction of crystal grains is vertical to the interface 47 can be effectively used. In other words, data can be written by efficiently causing the polarization inversion in the portion of the ferroelectric film 43 disposed directly below the interface 47. On the interface 47 between the ferroelectric film 43 and the high dielectric constant insulating film 46, the carriers are conducted. At this point, in order to cause the polarization inversion in the portion of the ferroelectric film 43 disposed directly below the interface 47, a distance between the source electrode 44 and the drain electrode 45 and the voltage $V_{app}$ are adjusted in the same manner as in Embodiment 2. Since the read operation of the semiconductor memory of this embodiment shown in FIG. 4 is the same as that of Embodiment 2, the description is herein omitted.

Embodiment 5

A semiconductor memory according to Embodiment 5 of the invention will now be described.

The semiconductor memory of Embodiment 5 of the invention has a structure including an interface conducting device capable of reading/writing data by detecting resistance change on an interface between a ferroelectric film and an insulating film and a transistor for driving the interface conducting device. It is assumed, in the following description, that the interface conducting device has the structure shown in FIGS. 2A and 2B.

Figure 5:
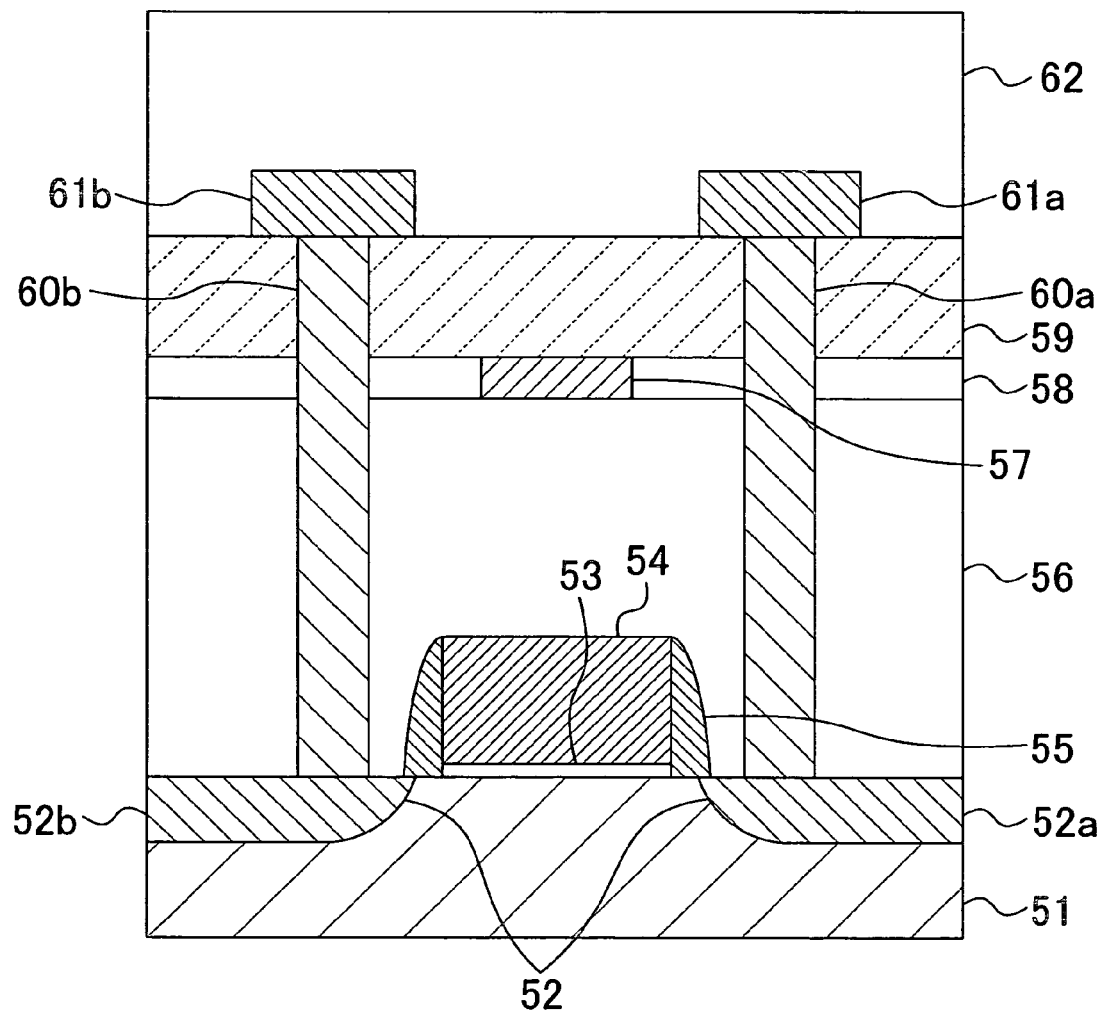
FIG. 5 is a cross-sectional view of a semiconductor memory according to Embodiment 5 of the invention.

FIG. 5 is a cross-sectional view for showing the structure of the semiconductor memory of Embodiment 5.

As shown in FIG. 5, a gate insulating film 53 made of, for example, a silicon oxide film is formed on a semiconductor substrate 51 of, for example, silicon, and a gate electrode 54 of a transistor made of, for example, polysilicon is formed on the gate insulating film 53. A sidewall 55 made of, for example, a silicon nitride film is formed on the side faces of the gate insulating film 53 and the gate electrode 54. In portions of the semiconductor substrate 51 disposed on sides of the sidewall 55, impurity diffusion layers 52 working as a drain electrode 52a and a source electrode 52b of the transistor are formed.

Also, a first insulating film 56 made of, for example, a silicon oxide film, a silicon nitride film or a silicon oxynitride film is formed on the semiconductor substrate 51 so as to cover the transistor. A write electrode 57 of an interface conducting device is formed on the first insulating film 56 in a position above the transistor, and a second insulating film 58 made of, for example, a silicon oxide film, a silicon nitride film or a silicon oxynitride film is formed on the first insulating film 56. A ferroelectric film 59 is formed on the write electrode 57 and the second insulating film 58. In the ferroelectric film 59, the second insulating film 58 and the first insulating film 56, a plug 60a made of, for example, tungsten is formed so as to penetrate these films and to have a lower end connected to the drain electrode 52a of the transistor, and a plug 60b made of, for example, tungsten is formed so as to penetrate these films and to have a lower end connected to the source electrode 52b of the transistor. On the ferroelectric film 59, a drain electrode 61a of the interface conducting device connected to the drain electrode 52a of the transistor through the plug 60a and a source electrode 61b of the interface conducting device connected to the source electrode 52b of the transistor through the plug 60b are formed. Also on the ferroelectric film 59, a third insulating film 62 made of, for example, a silicon oxide film, a silicon nitride film or a silicon oxynitride film is formed so as to cover the drain electrode 61a and the source electrode 61b of the interface conducting device.

At this point, the transistor having the aforementioned structure is preferably formed in a region below the interface conducting device having the write electrode 57 and the ferroelectric film 59 sandwiched between the source electrode 61b and the drain electrode 61a as shown in FIG. 5. Thus, the area occupied by a memory cell composed of the interface conducting device and the transistor can be reduced. Furthermore, in the case where the memory cell is provided in the form of an array as described in Embodiment 6 below, a part of the area occupied by the memory cell can be shared with another adjacent memory cell, and hence, the semiconductor memory can be refined.

In this embodiment, as the ferroelectric film 59, a ferroelectric material having polarization such as SBT ($SrBi_2Ta_2O_9$), SBTN ($SrBi_2(Ta, Nb)_2O_9$), BLT (($Bi, La)_4Ti_3O_{12}$), $BiFeO_3$, $PbTiO_3$, PZT ($Pb(Zr, Ti)O_3$), PLZT (($Pb, La)(Zr, Ti)O_3$), $BaTiO_3$, $LiNbO_3$ or $SrTiO_3$ may be used.

Also, as the write electrode 57, the drain electrode 61a and the source electrode 61b, metal materials such as platinum, gold, silver, copper and aluminum may be used.

Next, the operation of the memory cell composed of the interface conducting device and the transistor in the semiconductor memory having the aforementioned structure will be described.

<Write Operation>

First, a high voltage or a low voltage corresponding to data to be written is applied to the drain electrode 52a of the transistor. At this point, for example, a low voltage is applied to the gate electrode 54 of the transistor. Under this voltage application, when a pulse voltage is applied to the write electrode 57, a voltage is applied between the drain and source electrodes 61a and 61b and the write electrode 57 of the interface conducting device. Therefore, an extruded electric field, for example, as shown in FIG. 2B is generated between the drain and source electrodes 61a and 61b and the write electrode 57 of the interface conducting device, and therefore, spontaneous polarization is induced in the ferroelectric film 59 sandwiched between the drain and source electrodes 61a and 61b and the write electrode 57 of the interface conducting device. It is noted that the polarization direction in the ferroelectric film 59 is determined depending upon the voltage (the high voltage or the low voltage) corresponding to the data input to the drain electrode 52a of the transistor. Furthermore, the voltage to be applied should be sufficient for causing polarization inversion of the ferroelectric and the polarization inversion can be realized by adjusting a distance between the drain electrode 61a and the source electrode 61b of the interface conducting device and the applied voltage.

Data is written in this manner by causing the polarization inversion of the ferroelectric film 59 sandwiched between the drain and source electrodes 61a and 61b and the write electrode 57 of the interface conducting device.

<Read Operation>

First, the drain electrode 52a of the transistor is grounded. At this point, a ground voltage is applied to the gate electrode 53 of the transistor. Next, a voltage is applied to the drain electrode 52a of the transistor. Then, a voltage is applied to the source electrode 52b of the transistor. At this point, a current flowing between the drain electrode 61a and the source electrode 61b of the interface conducting device also flows between the drain electrode 52a and the source electrode 52b of the transistor, and therefore, when this current is detected by using an ammeter (not shown), data can be read. Specifically, since a current passing through the interface between the ferroelectric film 59 and the third insulating film 62 is different depending upon the polarization direction of the ferroelectric film 59, data can be read by detecting this current. At this point, since the applied voltage is set so as not to invert the ferroelectric, there is no need to write data again after the read operation.

In this manner, in the semiconductor memory of Embodiment 5 of the invention, the interface conducting device including the drain electrode 61a, the source electrode 61b, the write electrode 57, the ferroelectric film 59 and the third insulating film 62 and the transistor are used for reading/writing data by utilizing the change in the resistance of the interface between the ferroelectric film 59 and the third insulating film 62.

Embodiment 6

A semiconductor memory according to Embodiment 6 of the invention will now be described.

Figure 6:
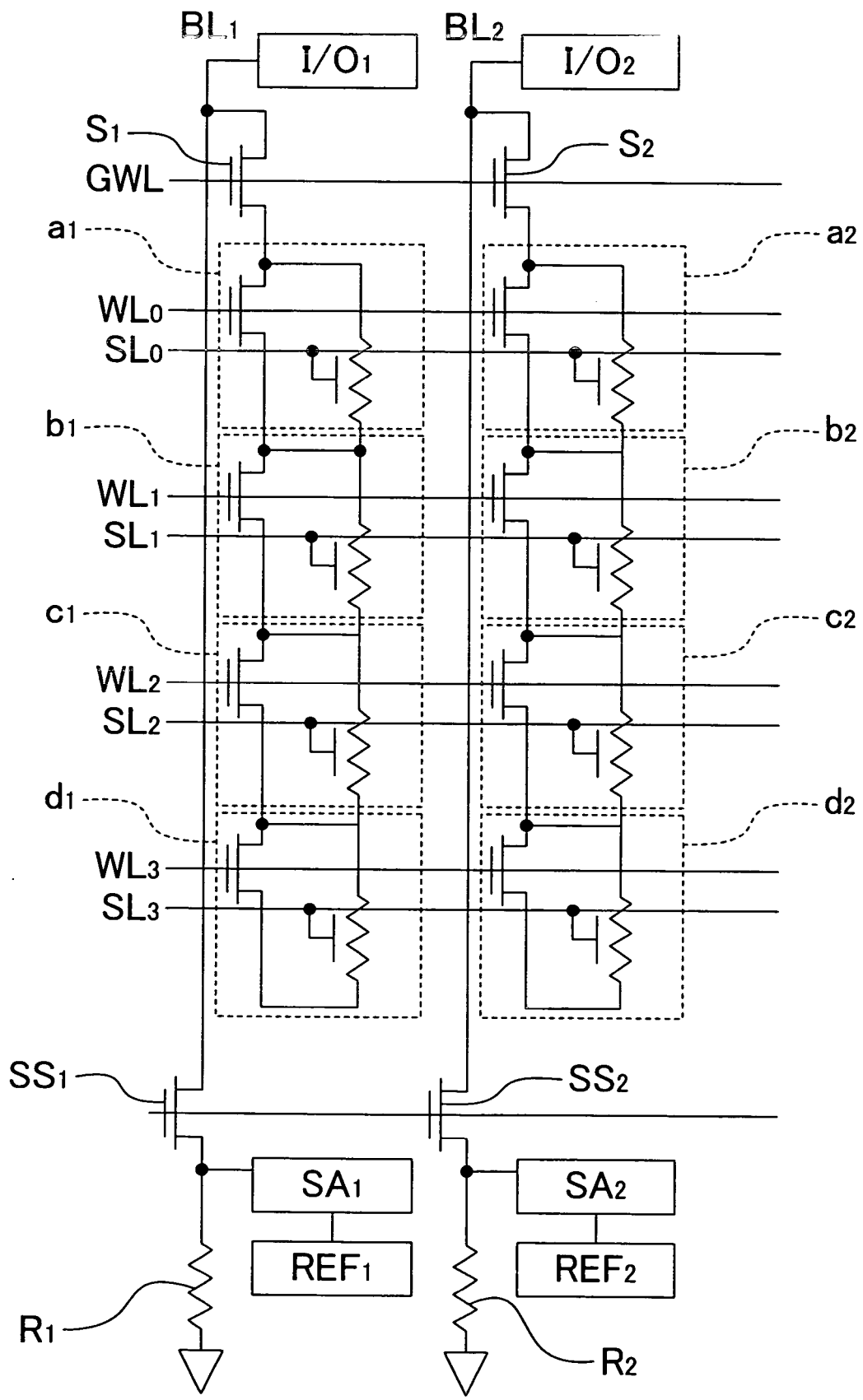
FIG. 6 is a circuit diagram of a semiconductor memory according to Embodiment 6 of the invention.

FIG. 6 is a circuit diagram for showing the structure of the semiconductor memory of Embodiment 6.

The semiconductor memory shown in FIG. 6 includes input/output buffer circuits $I/O_1$ and $I/O_2$ for inputting/outputting voltages corresponding to data to be written or to be read respectively to/from bit lines $BL_1$ and $BL_2$; memory cells $a_1$, through $d_1$ and $a_2$ through $d_2$ arranged in the form of an array and each composed of an interface conducting device including an interface resistance device and a transistor controlled by any of word lines $WL_0$ through $WL_3$; the bit lines $BL_1$ and $BL_2$ connected to the input/output buffer circuits $I/O_1$ and $I/O_2$ and connected to drain electrodes of the transistors included in the memory cells $a_1$, through $d_1$, and $a_2$ through $d_2$; source lines $SL_0$ through $SL_3$ connected to source electrodes of the interface conducting devices of memory cells adjacent to each other in the direction of the word lines $WL_0$ through $WL_3$ (i.e., the memory cells $a_1$ and $a_2$, $b_1$ and $b_2$, $c_1$ and $c_2$, and $d_1$ and $d_2$); first switches $S_1$ and $S_2$ controlled by a gate line GWL for controlling the connection between the interface conducting devices of the memory cells $a_1$ and $a_2$ and the bit lines $BL_1$ and $BL_2$; second switches $SS_1$ and $SS_2$ controlled by a gate electrode for controlling the connection between the bit lines $BL_1$ and $BL_2$ and sense amplifiers $SA_1$ and $SA_2$; the sense amplifiers $SA_1$ and $SA_2$ each connected to one electrode of a transistor included in the second switch $SS_1$ or $SS_2$; reference voltage generator circuits $REF_1$ and $REF_2$ respectively connected to the sense amplifiers $SA_1$ and $SA_2$; and resistance devices $R_1$ and $R_2$ each grounded at one end and connected to the other electrode of the transistor included in the second switch $SS_1$ or $SS_2$ at the other end.

In the memory cells $a_1$ through $d_1$, the memory cells adjacent in the direction of the bit lines $BL_1$ and $BL_2$ are connected to each other, and specifically, a source electrode of the transistor of each memory cell is electrically connected to a drain electrode of the transistor of an adjacent memory cell. For example, the source electrode of the transistor of the memory cell $a_1$ is connected to the drain electrode of the transistor of the memory cell $b_1$. Also, the memory cells $a_2$ through $d_2$ are similarly connected.

Although the four memory cells $a_1$ through $d_1$ and the four memory cells $a_2$ through $d_2$ are serially connected in two columns as an exemplified configuration in the above description, the number of memory cells included in one column and the number of columns may be arbitrarily designed.

Figure 7:
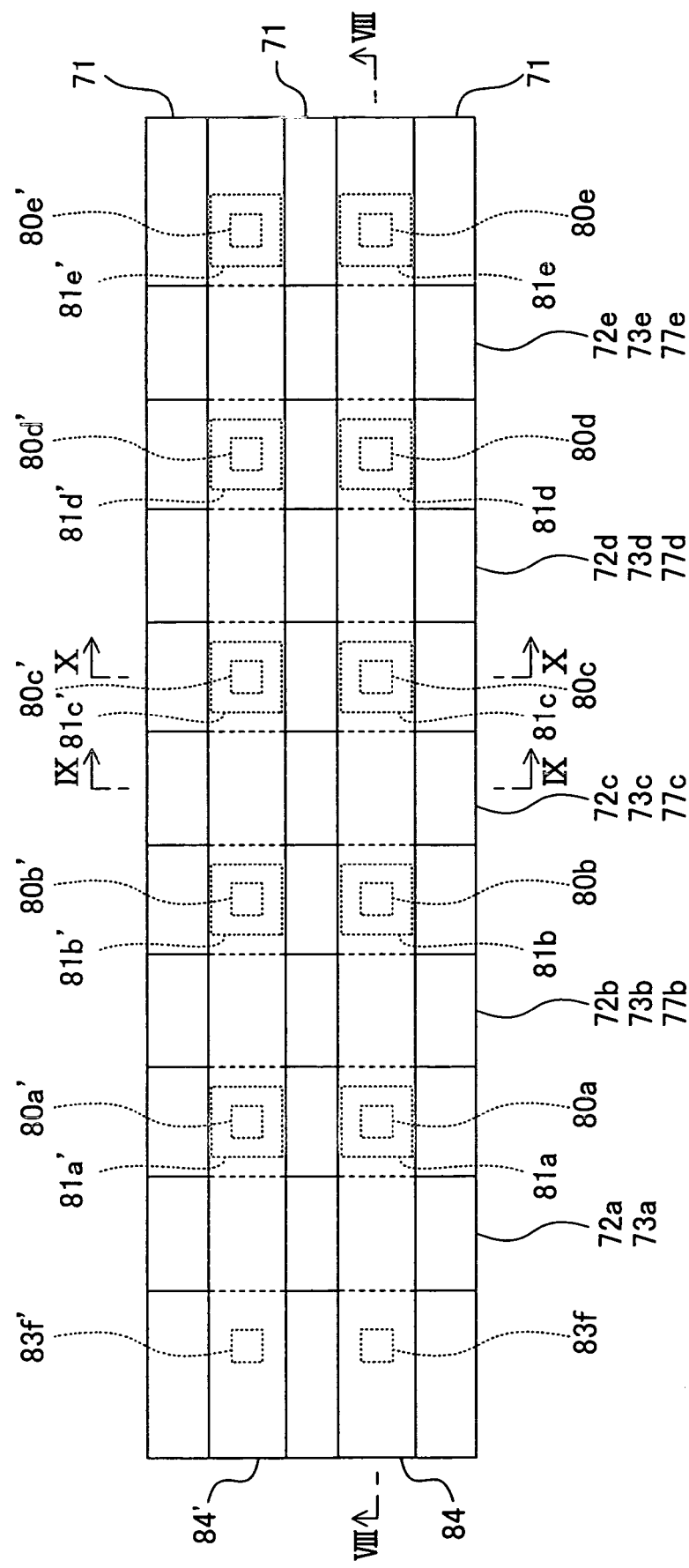
FIG. 7 is a layout diagram of the semiconductor memory of Embodiment 6 of the invention.

FIG. 7 is a layout diagram corresponding to the circuit configuration including the first switches $S_1$ and $S_2$, the memory cells $a_1$ through $d_1$, the memory cells $a_2$ through $d_2$, the bit lines $BL_1$ and $BL_2$ and the source lines $SL_0$ through $SL_3$ of FIG. 6. In FIG. 7, elements corresponding to composing elements shown in FIGS. 8 through 10 described in detail below are referred to by using the same reference numerals used in FIGS. 8 through 10.

As shown in FIG. 7, the first switch $S_1$ is formed mainly in a region where the gate line GWL (73a) and the bit line $BL_1$ (84) cross each other in a plan view, and the first switch $S_2$ is formed mainly in a region where the gate line GWL (73a) and the bit line $BL_2$ (84') cross each other in a plan view. Also, the four transistors included in the memory cells $a_1$ through $d_1$ are formed mainly in regions where the source lines $SL_0$ through $SL_3$ (write electrodes $77_b$ through $77_e$) cross the bit line $BL_1$ (84) in a plan view, and the four transistors included in the memory cells $a_2$ through $d_2$ are formed mainly in regions where the source lines $SL_0$ through $SL_3$ (the write electrodes $77_b$ through $77_e$) cross the bit line $BL_2$ (84') in a plan view. Furthermore, as shown in FIG. 7, plugs (80a through 80d) of the transistors included in the memory cells $a_1$ through $d_1$ are shared with the adjacent memory cells.

Next, the cross-sectional structure of the semiconductor memory of Embodiment 6 will be described.

Figure 8:
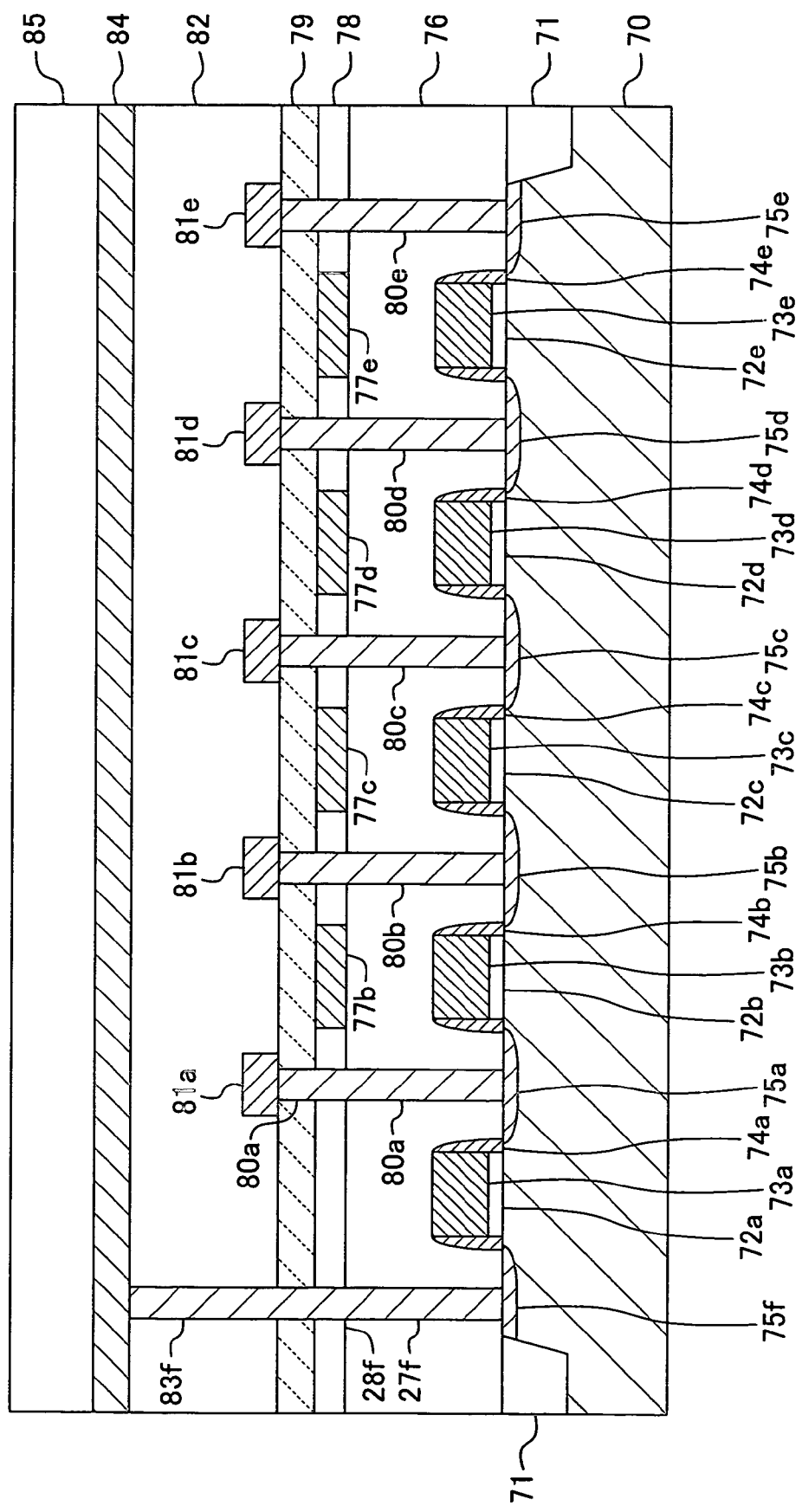
FIG. 8 is a cross-sectional view taken on line VIII-VIII of the semiconductor memory of Embodiment 6.
Figure 9:
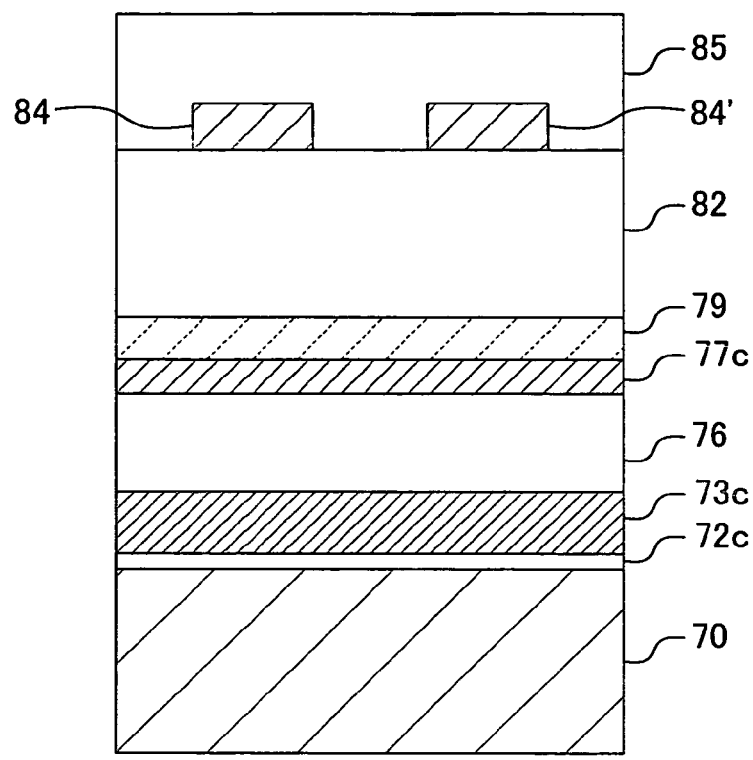
FIG. 9 is a cross-sectional view taken on line IX-IX of the semiconductor memory of Embodiment 6.
Figure 10:
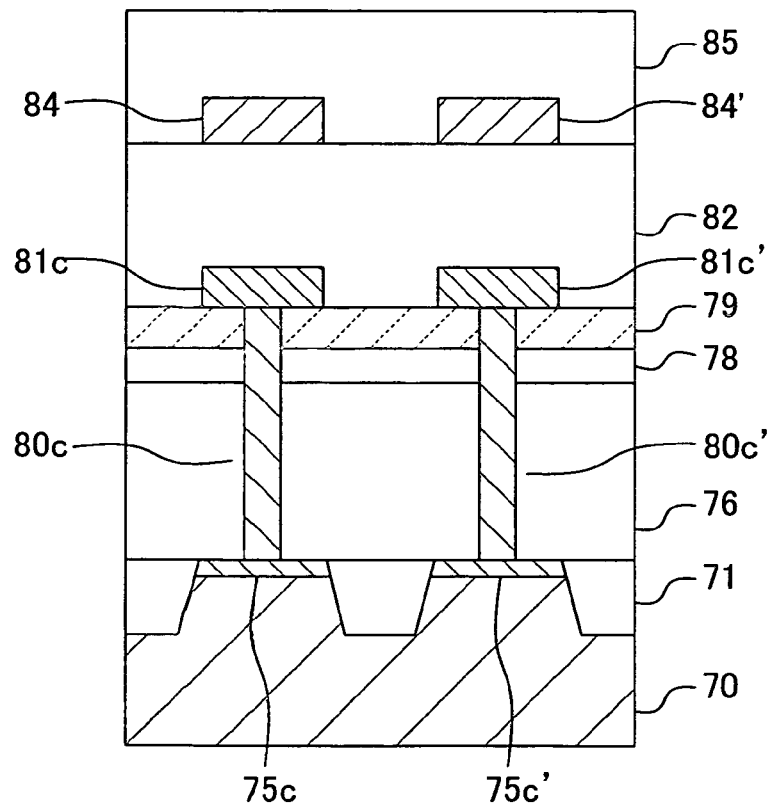
FIG. 10 is a cross-sectional view taken on line X-X of the semiconductor memory of Embodiment 6.

FIG. 8 is a cross-sectional view taken on line VIII-VIII of FIG. 7, FIG. 9 is a cross-sectional view taken on line IX-IX of FIG. 7 and FIG. 10 is a cross-sectional view taken on line X-X of FIG. 7.

In FIG. 8, the memory cells $a_1$ through $d_1$ each composed of the interface conducting device and the transistor, the bit line $BL_1$ and the first switch $S_1$ of the circuit shown in FIG. 7 are mainly shown. Although not shown in FIG. 8, the cross-sectional structure along the bit line $BL_2$ of the memory cells $a_2$ through $d_2$ and the first switch $S_2$ is similar to the cross-sectional structure shown in FIG. 8 described below, and is shown in an upper portion (using apostrophized reference numerals) in the layout diagram of FIG. 7.

As shown in FIG. 8, in a device forming region partitioned by an isolation insulating film 71 of, for example, STI (shallow trench isolation) in a semiconductor substrate 70 made of, for example, silicon, gate insulating films 72a through 72e made of, for example, a silicon oxide film and gate electrodes 73a through 73e made of, for example, a polysilicon film are successively formed in the upward direction, and sidewalls 74a through 74e made of, for example, a silicon nitride film are formed on the side faces of the gate insulating films 72a through 72e and the gate electrodes 73a through 73e. Furthermore, in portions of the semiconductor substrate 70 on sides of the sidewalls 74a through 74e, impurity diffusion layers 75a through 75f working as source electrodes and drain electrodes are formed. In this manner, a transistor working as the first switch $S_1$ including the gate electrode 73a and four transistors respectively including the gate electrodes 73b through 73e are formed.

Furthermore, a first insulating film 76 made of, for example, a silicon oxide film, a silicon nitride film or a silicon oxynitride film and having a thickness of approximately 200 nm is formed on the whole top face of the semiconductor substrate 70 so as to cover the five transistors. On the first insulating film 76, write electrodes 77b through 77e of the interface conducting devices are formed so as to be disposed respective above the four transistors including the gate electrodes 73b through 73e, and a second insulating film 78 made of, for example, a silicon oxide film, a silicon nitride film or a silicon oxynitride film and having a thickness of approximately 100 nm is formed.

A ferroelectric film 79 with a thickness of approximately 50 nm is formed on the write electrodes 77b through 77e and the second insulating film 78. In this case, the ferroelectric film 79 may be made of, for example, a ferroelectric material having polarization, such as SBT ($SrBi_2Ta_2O_9$), SBTN ($SrBi_2(Ta, Nb)_2O_9$), BLT (($Bi, La)_4Ti_3O_{12}$), $BiFeO_3$, $PbTiO_3$, PZT ($Pb(Zr, Ti)O_3$), PLZT (($Pb, La)(Zr, Ti)O_3$), $BaTiO_3$, $LiNbO_3$ or $SrTiO_3$. In the ferroelectric film 79, the second insulating film 78 and the first insulating film 76, plugs 80a through 80e made of, for example, tungsten are formed so as to penetrate these films and to have lower ends respectively connected to the impurity diffusion layers 75a through 75e of the transistors.

On the ferroelectric film 79, electrodes 81a through 81e working as source electrodes or drain electrodes of the interface conducting devices respectively connected to the impurity diffusion layers 75a through 75e of the transistors through the plugs 80a through 80e for detecting currents of the interface conducting devices are formed. Furthermore, on the ferroelectric film 79, a third insulating film 82 made of, for example, a silicon oxide film, a silicon nitride film or a silicon oxynitride film and having a thickness of, for example, 200 nm is formed so as to cover the electrodes 81a through 81e of the interface conducting devices. In the third insulating film 82, the ferroelectric film 79, the second insulating film 78 and the first insulating film 76, a plug 83f made of, for example, tungsten is formed so as to penetrate these films and to have a lower end connected to the impurity diffusion layer 75f. Moreover, a metal interconnect 84 corresponding to the bit line $BL_1$ and connected to the plug 83f at the lower face is formed on the third insulating film 82, and a fourth insulating film 85 made of, for example, a silicon oxide film, a silicon nitride film or a silicon oxynitride film and having a thickness of approximately 150 nm is formed on the metal interconnect 84.

Next, FIG. 9 mainly shows the two memory cells $b_1$ and $b_2$ and the two bit lines $BL_1$ and $BL_2$.

As shown in FIG. 9, the gate insulating film 72c, the gate electrode 73c and the first insulating film 76 are formed on the semiconductor substrate 70. The write electrode 77c is formed on the first insulating film 76, and the ferroelectric film 79 is formed on the write electrode 77c. The third insulating film 82 is formed on the ferroelectric film 79. The metal interconnect 84 corresponding to the bit line $BL_1$ and a metal interconnect 84' corresponding to the bit line $BL_2$ are formed on the third insulating film 82. Also, the fourth insulating film 85 is formed on the third insulating film 82 so as to cover the metal interconnects 84 and 84'.

Next, FIG. 10 mainly shows a region shared by the memory cells $b_1$ and $b_2$ and the memory cells $c_1$ and $C_2$.

As shown in FIG. 10, the impurity diffusion layers 75c and 75c' are formed in the device forming regions surrounded by the isolation insulating film 71 in the semiconductor substrate 70. The first insulating film 76, the second insulating film 78 and the ferroelectric film 79 are formed on the isolation insulating film 71 and the impurity diffusion layers 75c and 75c' and the plugs 80c and 80c' are formed so as to penetrate these films and to have lower ends respectively connected to the impurity diffusion layers 75c and 75c'. On the ferroelectric film 79, the electrodes 81c and 81c' working as a source electrode or a drain electrode of the interface conducting device and connected at lower faces thereof to the upper ends of the plugs 80c and 80c' are formed.

On the ferroelectric film 79, the third insulating film 82 is formed so as to cover the electrodes 81c and 81c', and the metal interconnect 84 corresponding to the bit line $BL_1$ and the metal interconnect 84' corresponding to the bit line $BL_2$ are formed on the third insulating film 82. Also, the fourth insulating film 85 is formed on the third insulating film 82 so as to cover the metal interconnects 84 and 84'.

The operation of the semiconductor memory of this embodiment having the aforementioned structure will now be described with reference to FIG. 7 referred to above and FIGS. 11A and 11B.

Figure 11:
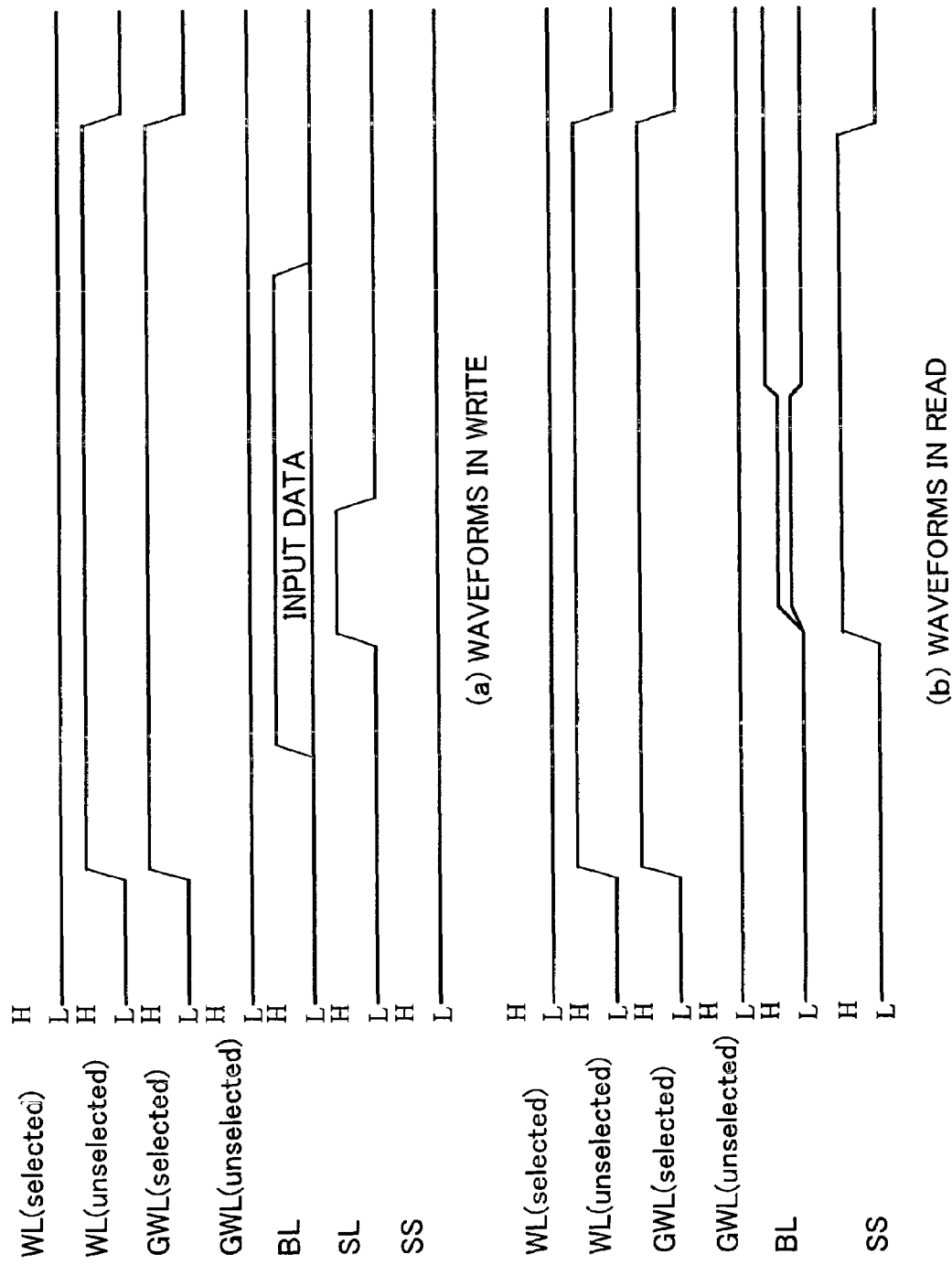
FIGS. 11A and 11B are waveform diagrams for explaining the operation of the semiconductor memory of Embodiment 6, and specifically.
Figure 12:
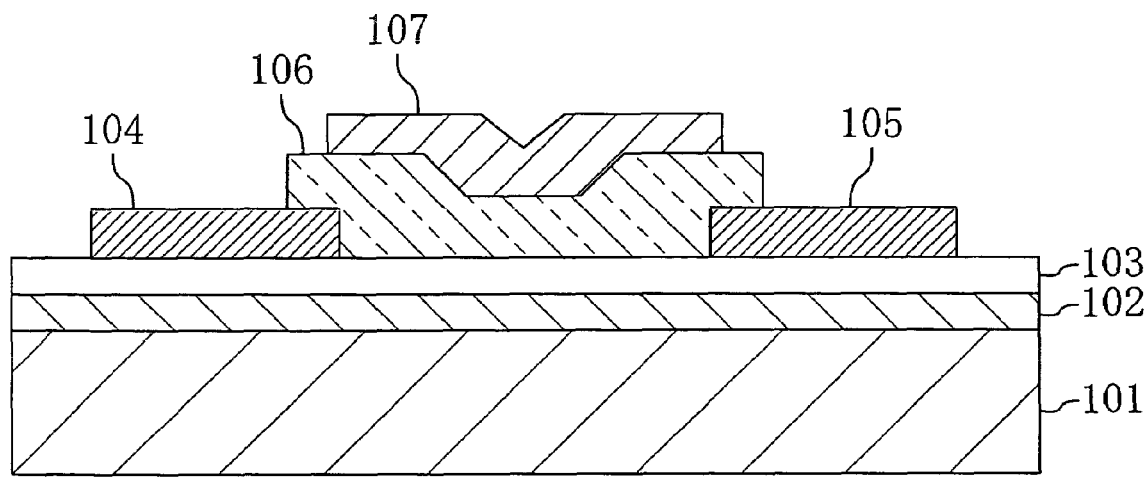
FIG. 12 is a cross-sectional view of a principal part of a conventional semiconductor memory.
Figure 13:
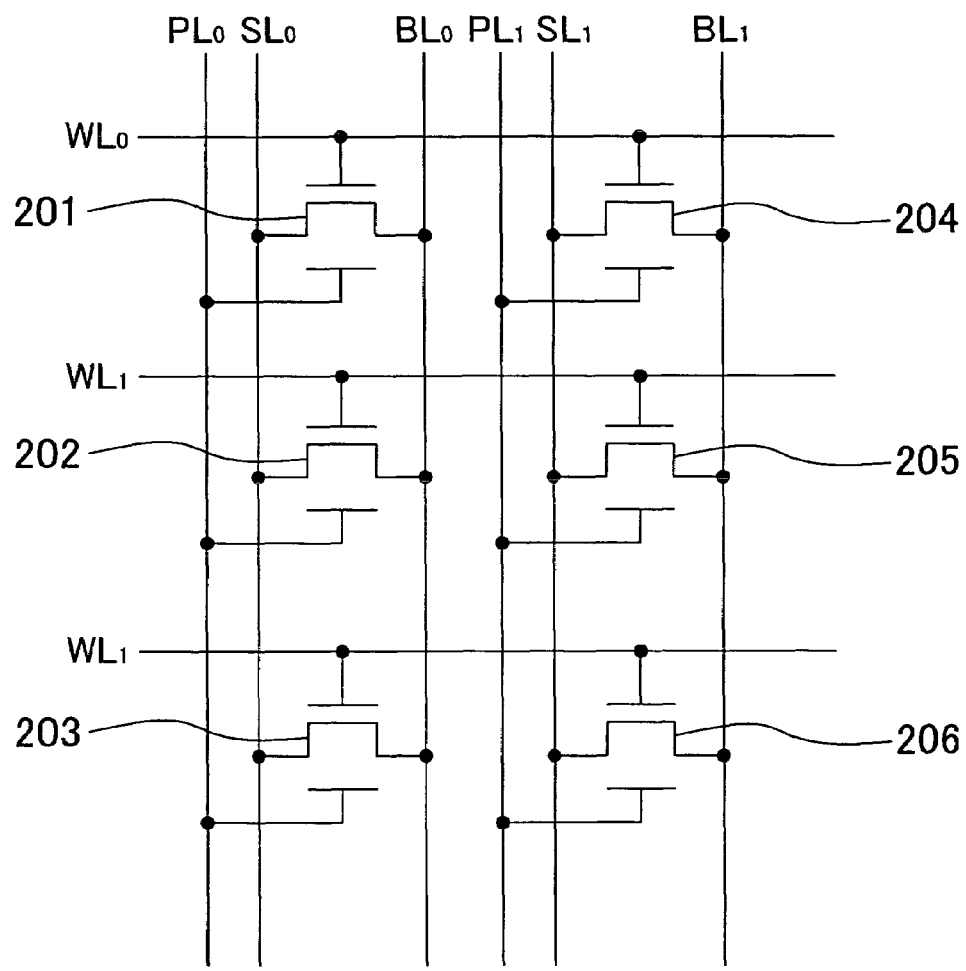
FIG. 13 is a circuit diagram of a semiconductor memory for explaining problems to be solved by the invention.

FIGS. 11A and 11B are operation waveform diagrams used for explaining exemplified voltage application procedures for writing/reading data, and FIG. 11A shows voltage waveforms used for writing data and FIG. 11B shows voltage waveforms used for reading data. It is noted that "H" indicates a voltage corresponding to a high voltage and "L" indicates a voltage corresponding to a low voltage in these diagrams. Also, in these drawings, a voltage applied to a word line WL of a memory cell selected for data write or data read is indicates as "WL (selected)"; a voltage applied to a word line WL of a memory cell not selected for data write or data read is indicated as "WL (unselected)"; a voltage applied to a gate line GWL for turning a first switch S on for disconnecting memory cells from a bit line is indicated as "GWL (selected)"; a voltage applied to a gate line GWL for turning a first switch S off is indicated as "GWL (unselected)"; a voltage applied to a bit line BL is indicated as "BL"; a voltage applied to a source line SL is indicated as "SL"; and a voltage applied to a second switch SS for connecting a sense amplifier SA is indicated as "SS".

<Write Operation>

First, all applied voltages are set to "L" level. Next, a voltage applied to a selected gate line GWL is increased to "H" level and a voltage applied to a word line WL of a memory cell not selected for data write is increased to "H" level. Thus, the source electrode corresponding to the read electrode of the interface conducting device of the memory cell selected for the data write is electrically connected to a bit line BL. Under this condition, a "H" or "L" voltage is applied to the bit line BL as a write voltage corresponding to data to be written. At this point, in the case where the write voltage is "H", a potential difference is caused from the "L" voltage of a source line SL, and hence, the polarization of the ferroelectric film 79 between the source line (the write electrode) and the source electrode of the interface conducting device of the selected memory cell is inverted. At this point, although the source line and the source electrode are not always disposed to overlap each other in a plan view, electric flux lines generated in the data write extend vertically from the source electrode and enter vertically the source line owing to the extruded electric field, the polarization of the ferroelectric film 79 disposed between the source line and the source electrode is sufficiently inverted. Next, under the application of the write voltage to the bit line BL, a pulse voltage is applied to the source line SL. At this point, in the case where the write voltage is "L", a "H" potential difference of the source line SL is caused between the source line and the source electrode of the interface conducting device of the selected memory cell, and hence, the polarization of the ferroelectric film 79 disposed between the source line and the source electrode of the interface conducting device included in the selected memory cell is inverted. Also, since the "H" voltage is applied to the gate electrode of the transistor of the memory cell not selected for the data write, the semiconductor memory is designed so that potential applied to the word line WL can be increased to be substantially equal to the threshold voltage of the transistor. Also, since a source line SL not selected is electrically disconnected to have high impedance, the source line and the source electrode of the interface conducting device of the memory cell not selected for the data write have the same potential. Therefore, no voltage is applied between the source line and the source electrode of the interface conducting device in the memory cell not selected for the data write, and the data write can be performed without reducing the polarization. Next, the potential of the bit line BL is returned to "L" level, the voltages applied to the word line WL of the memory cell not selected for the data write and the selected gate line GWL are returned to "L" level, and thus, the write operation is completed.

<Read Operation>

First, all applied voltages are set to "L" level. Next, a voltage applied to a word line WL of a memory cell not selected for the data read is increase to "H" level, and a selected gate line GWL is increased to "H" level. Thus, the source electrode corresponding to the read electrode of the interface conducting device included in a memory cell selected for the data read is electrically connected to a bit line. Under this condition, the source line SL is placed in a high impedance state, so as to prevent the polarization inversion from occurring in the data read. Then, a voltage applied to a second switch SS for connecting a sense amplifier SA is increased to "H" level. At this point, in accordance with the polarization direction of the ferroelectric film 79 disposed between the source line and the source electrode of the interface conducting device included in the selected memory cell, the resistance on the interface between the insulating film (the third insulating film) and the ferroelectric film 79 is different, and series resistance of the resistance and a reference resistance is formed. Therefore, when the value of the interface resistance of the interface conducting device included in the selected memory cell is changed, the voltage generated on the bit line BL is also changed. When this voltage is differentially amplified by the sense amplifier SA, a "H" or "L" voltage is generated on the bit line BL in accordance with the polarization state of the ferroelectric included in the memory cell selected for the data read. At this point, since the source electrode of the interface conducting device included in the selected memory cell and the source line have the same potential as in the data write operation, the polarization is never reduced through the read operation. Also, even when the polarization of the ferroelectric film 79 disposed between the source line and the source electrode of the interface conducting device included in the selected memory cell is slightly reduced through the read operation, data of "L" level is rewritten after the differential amplification of the sense amplifier SA, and when the voltage applied to the source line SL is subsequently reduced to "L" level, data of "H" level can be rewritten. Thereafter, the voltages applied to a second switch SS for connecting the sense amplifier SA, the word line WL of the memory cell not selected for the data read and the selected gate line GWL are reduced to "L" level, and thus, the read operation is completed.

In this manner, in the semiconductor memory of Embodiment 6 of the invention, the memory cell composed of the interface conducting device and the transistor of Embodiment 5 is disposed in the form of an array. Thus, a semiconductor memory for uniquely determining data read and free from the disturb problem can be provided.

It is noted that the semiconductor memory of this invention is useful as a nonvolatile memory using a ferroelectric film. Since Si is not used in the present invention, the invention is usefully applied to next generation process and to a memory device stacked on a logic. Furthermore, the semiconductor memory of this invention is useful for a densely packed mixed memory. Moreover, the invention is applicable to a densely high packed stand-alone memory.

What is claimed is:

1. A semiconductor memory comprising:
   a conducting film formed on a substrate;
   a ferroelectric film formed above or below said conducting film;
   a source electrode and a drain electrode disposed in positions opposing said conducting film with said ferroelectric film sandwiched therebetween and spaced from each other; and
   an insulating film formed between said source electrode and said drain electrode; and
   an electric field forming unit configured to form an electric field in a portion of said ferroelectric film disposed above or below said insulating film by using said conducting film and at least one of said source electrode and said drain electrode,
   wherein said semiconductor memory is a three-terminal field effect transistor, and three terminals of the three-terminal field effect transistor are said conducting film, said source electrode and said drain electrode.

2. The semiconductor memory of claim 1, wherein said conducting film is formed in each unit device forming region composed of, in a plan view, a region where said source electrode is disposed, a region where said drain electrode is disposed and a region where an interface between said ferroelectric film and said insulating film is disposed.

3. The semiconductor memory of claim 1, wherein said conducting film is formed above or below an interface between said ferroelectric film and said insulating film.

4. The semiconductor memory of claim 1, wherein a polarization direction of crystal grains included in the portion of said ferroelectric film disposed above or below said insulating film substantially accords with a direction of the electric field formed in the portion of said ferroelectric film disposed above or below said insulating film.

5. The semiconductor memory of claim 1,
   wherein said conducting film includes:
   a first portion opposing said source electrode with said ferroelectric film sandwiched therebetween; and
   a second portion spaced from said first portion and opposing said drain electrode with said ferroelectric film sandwiched therebetween.

6. The semiconductor memory of claim 5, wherein the electric field forming unit forms the electric field in a portion of said ferroelectric film disposed above or below said insulating film by using at least one of a combination of said first portion and said drain electrode and a combination of said second portion and said source electrode.

7. The semiconductor memory of claim 6, wherein a polarization direction of crystal grains included in the portion of said ferroelectric film disposed above or below said insulating film substantially accords with a direction of the electric field formed in the portion of said ferroelectric film disposed above or below said insulating film.

8. The semiconductor memory of claim 1, wherein a portion of said ferroelectric film disposed above or below said insulating film includes a single crystal grain.

9. The semiconductor memory of claim 1, wherein said insulating film has a higher dielectric constant than said ferroelectric film.

10. The semiconductor memory of claim 1, wherein said insulating film is made of a ferroelectric substance.

11. The semiconductor memory of claim 1, further comprising a current detecting unit configured to detect a current between said source electrode and said drain electrode.

* * * * *

UNITED STATES PATENT AND TRADEMARK OFFICE
CERTIFICATE OF CORRECTION

PATENT NO. : 7,629,635 B2  Page 1 of 1
APPLICATION NO. : 11/520011
DATED : December 8, 2009
INVENTOR(S) : Kaibara et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 352 days.

Signed and Sealed this

Second Day of November, 2010

David J. Kappos
*Director of the United States Patent and Trademark Office*